(12) United States Patent
Wu et al.

(10) Patent No.: US 7,902,119 B2
(45) Date of Patent: Mar. 8, 2011

(54) POROUS CERAMIC HIGH TEMPERATURE SUPERCONDUCTORS AND METHOD OF MAKING SAME

(76) Inventors: Judy Wu, Lawrence, KS (US); Rose Emergo, Lawrence, KS (US); Timothy Haugan, Beavercreek, OH (US); Paul Barnes, West Milton, OH (US)

( * ) Notice: Subject to any disclaimer, the term of this patent is extended or adjusted under 35 U.S.C. 154(b) by 490 days.

(21) Appl. No.: 11/490,918

(22) Filed: Jul. 21, 2006

(65) Prior Publication Data
US 2010/0113280 A1    May 6, 2010

Related U.S. Application Data

(60) Provisional application No. 60/701,862, filed on Jul. 22, 2005.

(51) Int. Cl.
*H01L 39/24* (2006.01)
*H01L 39/12* (2006.01)
(52) U.S. Cl. ......... 505/320; 505/325; 505/473; 505/511; 505/780; 505/785; 505/238; 505/239; 427/62; 427/63
(58) Field of Classification Search .................. 505/320, 505/325, 473, 511, 780, 785, 238, 239; 427/62, 427/63
See application file for complete search history.

(56) References Cited

U.S. PATENT DOCUMENTS
6,265,353 B1 * 7/2001 Kinder et al. .................. 505/238
6,830,776 B1 * 12/2004 Barnes et al. .................... 427/63

OTHER PUBLICATIONS

Emergo et al., "Thickness dependence of superconducting critical current density in vicinal YBa2Cu3O7-x thick films", Applied Pysics Letters (Jul. 2004), 85, 4, 618-620.*
Emergo et al., "Tuning porosity of YBa2Cu3O7-x vicinal films by insertion of Y2BaCuO5 nanoparticles", Applied Physics Letters (2005), 87, 232503, 1-3.*
Haugan et al., "Island growth of Y2BaCuO5 nanoparticles in (211~1.5 nm/123~10 nm)XN composite multilayer structures to enhance flux pinning of YBa2Cu3O7-x films", J. Mater. Res., (Nov. 2003), 18,11, 2618-2623.*
Wu et al., "Jcs in HTS thick films: Influence of out-of-plane misorientation", invited paper in Proceeding of Electrochemistry Society 204 Annual Conference, Orlando, FL, Oct. 2003.*
Wu et al., "Thickness dependence of Jcs in YBCO, Tl-2212 and Hg-1212 thick films", invited paper in Proceeding of American Ceramic Society 105 Annual Conference, Nashville, TN, Apr. 27-30, 2003.*
Luborsky et al., *Reproducible sputtering and properties of Y-Ba-Cu-O films of various thicknesses,* J. Appl. Phys. 64, 6388 (1988) [Abstract Only].
Busch et al., *High-quality $Y_1Ba_2Cu_3O_{6.5+x}$ films on large area by chemical vapor deposition,* J. Appl. Phys. 70, 2449 (1991) [Abstract Only].
Foltyn et al., *Pulsed laser deposition of thick $YBa_2Cu_3O_{7-\delta}$ films with $J_c > 1\ MA/cm^2$,* Appl. Phys. Lett. 63, 1848 (1993) [Abstract Only].
Lowndes et al., *Strong, Asymmetric Flux Pinning by Miscut-Growth-Initiated Columnar Defects in Epitaxial $YBa_2Cu_3O_{7-x}$ Films,* Phys. Rev. Lett. 74, 2355 (1995).
A. A. Polyanskii et al., *Magneto-optical study of flux penetration and critical current densities in [001] tilt $YBa_2Cu_3O_{7-\delta}$ thin-film bicrystals,* Phys. Rev. B 53, 8687 (1996) [Abstract Only].
T. Haage et al., *Transport properties and flux pinning by self-organization in $YBa_2Cu_3O_{7-\delta}$ films on vicinal $SrTiO_3$(001),* Phys. Rev. B 56, 8404 (1997).
L. Mechin et al., *Properties of $YBa_2Cu_3O_{7-\delta}$ thin films grown on vicinal $SrTiO_3$(001) substrates,* Physica C 302, 102 (1998).
J. Brotz and H. Fuess, *Anisotropic defect structure and transport properties of $YBa_2Cu_3O_{7-\delta}$ films on vicinal $SrTiO_3$(001),* J. Appl. Phys. 85, 635 (1999).
Durrell et al., *Determination of Pinning Forces on Vortex Lines in $YBa_2Cu_3O_{7-\delta}$,* Supercond. Sci. Technol. 12, 1090 (1999).
Foltyn et al., *Relationship between film thickness and the critical current of $YBa_2Cu_3O_{7-\delta}$ coated conductors,* Appl. Phys. Lett. 75, 3692 (1999) [Abstract Only].
Durrell et al., *Dependence of Critical Current on Field Angle in Off-c-axis Grown $Bi_2Sr_2CaCu_2O_8$ film,* Appl. Phys. Lett. 77, 1686 (2000).
Paranthaman et al., $YBa_2Cu_3O_{7-\delta}$ *Coated Conductors with High Engineering Current Density,* J. Mater. Res. 15, 2647 (2000) [Abstract Only].
Larbalestier, et al., *High-$T_c$ superconducting materials for electric power applications,* Nature 414, 368 (2001). Kang et al., *Comparative study of thickness dependence of critical current density of $YBa_2Cu_3O_{7-\delta}$ on (100) $SrTiO_3$ and on rolling-assisted biaxially textured substrates,* J. Mater. Res. 17, 1750 (2002) [Abstract Only].
Haugan et al., *Island growth of $Y_2BaCuO_5$ nanoparticles in $(211_{~1.5nm}/123_{~10nm})xN$ composite multilayer structures to enhance flux pinning of $YBa_2Cu_3O_{7-\delta}$ films,* J. Mater. Res., 18, 2618 (2003) [Abstract Only].
Maurice et al., *Effects of Surface Miscuts on the Epitaxy of $YBa_2Cu_3O_{7-\delta}$ and $NdBa_2Cu_3O_{7-\delta}$ on $SrTiO_3$(001),* Phs. Rev. B 68 115429 (2003).
Durrell et al., *Critical currents in vicinal $YBa_2Cu_3O_{7-\delta}$ films,* Phys. Rev. B 70, 214508 (2004) [Abstract Only].
Haugan et al., *Addition of nanoparticle dispersions to enhance flux pinning of the $YBa_2Cu_3O_{7-x}$ superconductor,* Nature 430, 867 (2004) [Abstract Only].
Cantoni et al., *Anisotropic nonmonotonic behavior of the superconducting critical current in thin $YBa_2Cu_3O_{7-\delta}$ films on vicinal $SrTiO_3$ surfaces,* Phys. Rev. B 71, 054509 (2005).
Durrell, *Critical Current Anisotropy in High Temperature Superconductors,* Dissertation, University of Cambridge (2001).

* cited by examiner

*Primary Examiner* — Douglas Mc Ginty
(74) *Attorney, Agent, or Firm* — Stinson Morrison Hecker LLP

(57) ABSTRACT

Porous ceramic superconductors having a film thickness over 0.5 microns are provided. The superconducting material is applied to a vicinal substrate and optionally nanoparticles are inserted to release local strain. The resultant superconductors exhibit improved Jc values compared to nonvicinal (flat) counterparts and those having no nanoparticles.

33 Claims, 14 Drawing Sheets

1 mm 1 mm 1 mm 1 mm

POROUS CERAMIC HIGH TEMPERATURE SUPERCONDUCTORS AND METHOD OF MAKING SAME

CROSS-REFERENCE TO RELATED APPLICATIONS

This application is based on and claims priority to U.S. Provisional Application Ser. No. 60/701,862, filed on Jul. 22, 2005, which is hereby incorporated by reference.

STATEMENT REGARDING FEDERALLY SPONSORED RESEARCH OR DEVELOPMENT

The present invention was sponsored by the Air Force Office of Scientific Research, Grant No. 32980 and 27771, and the government may have certain rights in the invention.

BACKGROUND OF THE INVENTION

1. Field of the Invention

The present invention relates to high temperature superconductors, and more particularly, to a superconductor incorporating therein a superconductivity epitaxial film having a porous structure and a method for manufacturing the same.

2. Description of Related Art

Electrical resistance, in many applications, is very undesirable. For example, in electrical power transmission, electrical resistance causes power dissipation. The power dissipation grows in proportion to the current in normal wires. Thus, wires carrying large currents dissipate large amounts of energy. It is therefore desirable to fabricate a device that has little or no resistance. Such devices are commonly known as "superconductors."

Many different materials can become superconductors when their temperature is cooled below the transition temperature $T_c$. For example, some classical superconductors (along with their respective $T_c$ values in degrees Kelvin (K)) include carbon 15 K, lead 7.2 K, lanthanum 4.9 K, tantalum 4.47 K, and mercury 4.47 K.

In recent years, much research has focused on high temperature superconductors ("HTS"). Many of these materials have superconductive properties at a temperature above that of liquid nitrogen (77 K). Some HTS (along with their respective $T_c$ values in degrees K.) include $Hg_{0.8}Tl_{0.2}Ba_2Ca_2Cu_3O_{8.33}$ 138 K, $Bi_2Sr_2Ca_2Cu_3O_{10}$ 118 K, and $YBa_2Cu_3O_{7-\delta}$ 93 K. The last superconductor falls under the class of "YBCO" superconductors, based on its components, namely yttrium, barium, copper, and oxygen, and is regarded as the one of the highest performing, high temperature superconductors, especially for electric power applications. See generally Goyal et al., *High critical current density superconducting tapes by epitaxial deposition of $YBa_2Cu_3O_x$ thick films on biaxially textured metal*, Appl. Phys. Lett. 69, 1795 (1996); Wu et al., *Properties of $YBa_2Cu_3O_{7-\delta}$ thick films on flexible buffered metallic substrates*, Appl. Phys. Lett. 67, 2397 (1995); Larbalestier et al., *High-$T_c$ Superconducting Materials For Electric Power Applications*, Nature 414, 368 (2001).

Among other specifications, the critical current ($J_c$) is the most critical one for most HTS applications that include high-field magnets, electrical motors, generators and large-capacity power transmission lines. To carry high current, the HTS coatings must have thickness of a few to several micrometers. Unfortunately, the $J_c$ values of conventional YBCO films deposited on both single crystal and bi-axially textured metal substrates experienced a monotonic decrease with increasing film thickness. This $J_c$-thickness behavior has motivated an extensive effort during the past few years to investigate the related mechanism. See generally Luborsky et al., *Reproducible sputtering and properties of Y—Ba—Cu—O films of various thicknesses*, J. Appl. Phys. 64, 6388 (1988); Foltyn et al., *Pulsed laser deposition of thick $YBa_2Cu_3O_{7-\delta}$ films with $J_c \leq 1$ $MA/cm^2$*, Appl. Phys. Lett. 63, 1848 (1993); Busch et al., *High-quality $Y_1Ba_2Cu_3O_{6.5+x}$ films on large area by chemical vapor deposition*, J. Appl. Phys. 70, 2449 (1991); Miura et al., *Structural and electrical properties of liquid phase epitaxially grown $Y_1Ba_2Cu_3O_x$ films*, Physica C. 278, 201 (1997); Foltyn et al., *Relationship between film thickness and the critical current of $YBa_2Cu_3O_{7-\delta}$ coated conductors*, Appl. Phys. Lett. 75, 3692 (1999); Paranthaman et al., *$YBa_2Cu_3O_{7-y}$ Coated Conductors with High Engineering Current Density*, J. Mater. Res. 15, 2647 (2000); Kang et al., *Comparative study of thickness dependence of critical current density of $YBa_2Cu_3O_{7-\delta}$ on* (100) $SrTiO_3$ *and on rolling-assisted biaxially textured substrates*, J. Mater. Res. 17, 1750 (2002).

In recent years, researchers have also investigated the effects of small substrate miscuts on the microstructure of thin films. For example, Durrell, *Critical Current Anisotropy in High Temperature Superconductors*, Dissertation (April 2001), observed small pinholes in a de-oxygenated YBCO thin films grown on a 2°, 4°, 10°, and 20° vicinal substrates. This work all involved thin films less than 200 nm thick, and usually resulted in "pinholes" of varying diameters. The pinholes appear to be shallow holes that appear on the film surface. See also Durrell et al., *Critical currents in vicinal $YBa_2Cu_3O_{7-\delta}$ films*, Phys. Rev. B 70, 214508 (2004); Durrell et al., *Dependence of Critical Current on Field Angle in Off-c-axis Grown $Bi_2Sr_2CaCu_2O_8$ film*, Appl. Phys. Lett. 77, 1686 (2000) (120 nm thin film on a 10° vicinal substrate); Durrell et al., *Determination of Pinning Forces on Vortex Lines in $YBa_2Cu_3O_{7-\delta}$*, Supercond. Sci. Technol. 12, 1090 (1999) (120 nm thin film on a 6° vicinal substrate); L. Mechin et al., *Properties of $YBa_2Cu_3O_{7\delta}$ thin films grown on vicinal $SrTiO_3$* (001) *substrates*, Physica C 302, 102 (1998) (160 nm thin film on 2°, 4°, and 6° vicinal substrates).

Other groups have observed columnar defects on the order of 2-3 nm in diameter (but no pore formation) in vicinal films deposited after high-temperature pre-treatment of the substrates. For example, in Maurice et al., *Effects of Surface Miscuts on the Epitaxy of $YBa_2Cu_3O_{7-\delta}$ and $NdBa_2Cu_3O_{7-y}$ on $SrTiO_3$*(001), Phs. Rev. B 68 115429 (2003) investigated 200 nm (0.2 μm) thin films deposited on a heat-annealed substrate with a vicinal angle varying between 0.2° and 1.2°. See also Lowndes et al., *Strong, Asymmetric Flux Pinning by Miscut-Growth-Initiated Columnar Defects in Epitaxial $YBa_2Cu_3O_{7-x}$ Films*, Phys. Rev. Lett. 74, 2355 (1995) (columnar defects in 0.5 to 1.0 μm films on 2° annealed vicinal substrates); T. Haage et al., *Transport properties and flux pinning by self-organization in $YBa_2Cu_3O_{7-\delta}$ films on vicinal $SrTiO_3$*(001), Phys. Rev. B 56, 8404 (1997) (24 to 360 nm thin films on annealed 10° vicinal substrates); T. Haage et al., *Substrate-mediated anisotropy of transport properties in $YBa_2Cu_3O_{7-\delta}$ thin films*, Sol. Stat. Com. 99, 553 (1996) (0.24 μm thin film on 10° annealed vicinal substrate); J. Brotz and H. Fuess, *Anisotropic defect structure and transport properties of $YBa_2Cu_3O_{7-\delta}$ films on vicinal $SrTiO_3$*(001), J. Appl. Phys. 85, 635 (1999) (60 nm thin films on 10° annealed vicinal substrate); Cantoni et al., *Anisotropic nonmonotonic behavior of the superconducting critical current in thin $YBa_2Cu_3O_{7-\delta}$ films on vicinal $SrTiO_3$ surfaces*, Phys. Rev. B 71, 054509 (2005) (150 to 250 nm thin films on 0.4°, 4°, and 8° vicinal annealed substrates).

In recent years, a few researchers have also investigated the effect of depositing island-like nanoparticles (as opposed to homogenous epitaxial layers) on the superconducting layer microstructure. See Haugan et al., *Island growth of $Y_2BaCuO_5$ nanoparticles in $(211_{\sim 1.5\ nm}/123_{\sim 10\ nm}) \times N$ composite multilayer structures to enhance flux pinning of $YBa_2Cu_3O_{7-\delta}$ films*, J. Mater. Res., 18, 2618 (2003); Haugan et al., *Addition of nanoparticle dispersions to enhance flux pinning of the $YBa_2Cu_3O_{7-x}$ superconductor*, Nature 430, 867 (2004), These experiments were performed on flat substrates, and resulted in improved $J_c$ values at applied magnetic fields.

The effect of $J_c$ on superconducting thick films (greater than 0.5 μm) deposited on vicinal substrates remains unknown, especially as to substrates that have not undergone high-temperature pre-treatment of the substrate. The present invention relates a method of improving $J_c$ in thick films, having a thickness in the range of 0.5 to 3.0 μm, by altering the film microstructure by strain engineering at nanometer scales using vicinal substrates. The resulting superconducting film is porous in nature. Despite the decrease in cross-sectional area, the $J_c$ is unexpectedly increased compared to films deposited on flat substrates. In addition, the present invention demonstrates that by inserting nanoparticles into the superconducting film, the pore density can be increased and pore dimension varied. The insertion of island-like nanoparticles likely releases the strain accumulated with increasing thickness of the vicinal films in a favorable matter, resulting in a higher $J_c$ compared to superconductors prepared without nanoparticles.

BRIEF SUMMARY OF THE INVENTION

It is an object of the present invention to provide superconducting films that are porous in nature, which result in improved $J_c$ and $I_c$ values compared to films of similar thickness that are non-porous in nature. The superconducting films preferably have a thickness above about 0.5, 1.0, 2.0, and 3.0 microns.

It is another object of the present invention to provide porous superconducting films that are YBCO films.

In still another aspect, it is an object of the present invention to provide a porous superconducting film on a vicinal substrate. Exemplary pores have a circular cross-section with an average pore size, preferably ranging between about 30 to 300 nm in diameter with smaller pores being most preferred. The pores may also be irregularly shaped, e.g. having a oblong, boomerang, dog-boned, rectangular, and the like cross-section.

In another aspect, the present invention is directed to a method for controlling superconducting film porosity by using a vicinal or miscut substrate. Because the superconducting film is grown at an angle tilted from the normal of the substrate, this results in step-flow growth. In exemplary aspects, the film is grown on 5°, 10°, 15°, or 20° miscut or vicinal substrates.

In yet another aspect, the present invention is directed to a method for controlling superconducting film porosity by the introduction of island-like nanoparticles during film growth. In one aspect, the nanoparticles are generated in situ in multi-"layer"-type of growth of YBCO and $Y_2BaCuO_5$ (211) in vacuum-based processes such as pulsed laser deposition. Typically, the nanoparticles are about 1 to 40 nm in diameter, more preferably about 5 to 20 nm, and most preferably about 8 nm in diameter when observed from the film surface.

In still another aspect, the present invention is directed to the preparation of superconducting films that are porous in nature by using a combination of vicinal substrate and nanoparticle deposition.

In the present invention, experiments were performed to probe the correlation between $J_c$ and YBCO film thickness with respect to microstructure when the substrate has not undergone any heat pre-treatment. It was surprisingly discovered that higher $J_c$ values were obtained at 77 K and self-field ("SF") in vicinal YBCO films of small miscut angle of between about 5°-20° as compared to their nonvicinal (to be regarded as "flat") counterparts. Furthermore, a slower decrease of $J_c$ with film thickness was observed in the vicinal samples.

In another aspect, an object of the present invention is to illustrate the different microstructures between the vicinal and flat YBCO films based on the different film nucleation modes on the two types of substrates. In the vicinal substrates, YBCO films nucleate via the step-flow mode while on the flat ones, island-type growth mode. In general, films deposited on nonvicinal substrates are dense with an increasing volume fraction of misoriented (or non-c-axis oriented) grains at thicknesses above about 0.5-1.0 μm. Films deposited on vicinal substrates, on the other hand, are highly porous at thicknesses above about 0.5 to 0.1 μm while negligible misoriented grains were observed at thicknesses up to 3.0 μm.

In another aspect, a method of improving the $J_c$ in thick superconducting films is provided by introducing a porous microstructure in the films. It is theorized that the pore surface may provide the most efficient pinning on magnetic vortices and thus improve $J_c$. In addition, the pores can divide the current path into multi-filamentary like and the effective dimension for each filament is reduced to a length scale comparable to the magnetic penetration depth λ, which is on the order of a few hundred nanometers for YBCO. No magnetic vortices can be formed inside the superconductor film when the film dimension perpendicular to the current is smaller than 2λ, and in this case the theoretical upper limit of the $J_c$—the depairing $J_c$ can be achieved. In the present invention, the $J_c$ of the porous films is preferably greater than about greater by at least 50% or more than the YBCO films without pores, even for thick films.

In another aspect, a method for turning the porosity of the superconducting film is provided. In general, the downside of including pores in HTS films is the reduction of cross-sectional area for the current flow, which can result in reduced $J_c$. To minimize reduction of the current cross-sectional area so as to obtain a net $J_c$ enhancement, the dimension of the pores should be as small as possible, preferably on the order of a few times the coherence length ξ. For YBCO, ξ is anisotropic and typically in the range of about 0.3 to 1 nm.

Additional aspects of the invention, together with the advantages and novel features appurtenant thereto, will be set forth in part in the description that follows, and in part will become apparent to those skilled in the art upon examination of the following, or may be learned from the practice of the invention. The objects and advantages of the invention may be realized and attained by means of the instrumentalities and combinations particularly pointed out in the appended claims.

DETAILED DESCRIPTION OF PREFERRED EMBODIMENT

Figure 1:
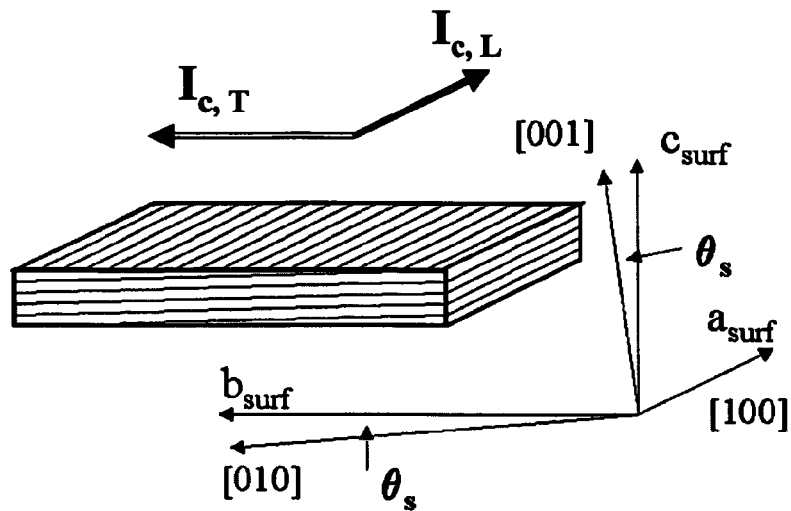
FIG. 1 is a schematic of a vicinal film grown on a miscut substrate of tilt angle of $\theta_s$ and definition of longitudinal critical current ($I_{c,L}$) and transverse one ($I_{c,T}$). The $a_{surf}$, $b_{surf}$ and $c_{surf}$ correspond to the a-, b-, and c-axes, respectively, without the miscut tilting of $\theta_s$.

The present invention is concerned with high temperature superconductors having a porous film structure and a method of making the same.

The superconducting devices according to an embodiment of the present invention include a substrate, a porous superconducting film, and optionally one or more other layers as is known in the art. For example, the superconducting device may contain a substrate, a buffer layer overlying the substrate, a superconductor layer, followed by a capping layer (typically a noble metal layer), and a stabilizer layer (typically a non-noble metal).

Suitable substrate materials for forming the superconducting devices are well known to those skilled in the art. The substrate is usually single crystals. Polycrystalline material such as a metal or a ceramic such as polycrystalline aluminum oxide or polycrystalline yttria-stabilized zirconia ("YSZ") or a polycrystalline metal such as nickel can also be used as substrates. Single crystal substrates, polycrystal substrates, or even amorphous substrates covered with an epi buffer template are usually preferred. Alloys including nickel such as various Hastelloy metals, Haynes metals, and Inconel metals are also useful as the substrate. Other substrate materials include silicon (Si), gallium arsenide (GaAs), metal, magnesium oxide (MgO), and strontium titanium oxide (SrTiO$_3$ or STO).

The substrate should preferably allow for the resultant article to be flexible whereby superconducting articles (e.g., coils, motors, or magnets) can be shaped. The substrate can thus be mechanically polished, electrochemically polished, or chemically mechanically polished to provide a smoother surface.

Various high temperature superconducting materials for forming the superconducting layer are also well known in the art. Exemplary materials yttrium, bismuth, and thallium based materials such as $YBa_2Cu_3O_{7-\delta}$, $Y_2Ba_4Cu_7O_{14+x}$, or $YBa_2Cu_4O_8$, ("YBCO"), $NbBa_2Cu_3O_{7-x}$, $LaBa_2Cu_3O_{7-x}$ $Bi_2Sr_2Ca_2Cu_3O_y$, $Pb_{2-x}Bi_xSr_2Ca_2Cu_3O_y$, $Bi_2Sr_2CaCu_2O_z$, $Tl_2Ba_2CaCu_2O_x$, $Tl_2Ba_2Ca_2Cu_3O_y$, $Tl_1Ba_2Ca_2Cu_3O_z$, $Tl_{1-x}Bi_xSr_{2-y}Ba_yCa_2Cu_4O_z$, $TlBa_2CaCu_2O_z$, $HgBa_2CaCu_2O_y$, $HgBa_2Ca_2Cu_3O_y$, $MgB_2$, copper oxides, rare earth metal oxides, and other high temperature superconductors. $YBa_2Cu_3O_{7-\delta}$ is preferred as the superconducting material.

The high temperature superconducting materials, e.g., a YBCO layer, can be deposited, e.g., by pulsed laser deposition or by methods such as evaporation including coevaporation, e-beam evaporation, and activated reactive evaporation, sputtering including magnetron sputtering, ion beam sputtering, and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like. Preferable deposition methods include sputtering, pulsed laser deposition, the chemical vapor deposition, the dual ion beam deposition, the E-beam evaporation, or the spin coating technique.

As discussed more fully below, the superconducting film is porous in nature by fabricating the film on a miscut or vicinal substrates. In addition, insertion of island-like nanoparticles during film formation improves the $J_c$ values compared to films on flat or vicinal substrates.

Various buffer layers, which may optionally reside between the substrate and superconducting film, are also well known in the art. The buffer layer may be a single layer, or more commonly, be made up of several films. Magnesium oxide (MgO) is a typical material of choice and may be on the order of 50 to 500 Angstroms, such as 50 to 200 Angstroms. Other suitable materials include NiO, YSZ, $CeO_2$, $Y_2O_3$, $TiO_2$, $SnO_2$, $Mn_3O_4$, $Fe_3O_4$, $Cu_2O$, and $RE_2O$ (where RE is a rare earth element).

Various capping and/or stabilizing layers are also well known to those skilled in the art. The capping layer and the stabilizer layer are generally implemented for electrical stabilization, to aid in prevention of superconductor burnout in practical use. More particularly, layers and aid in continued flow of electrical charges along the superconductor in cases where cooling fails or the critical current density is exceeded, and the superconductor layer moves from the superconducting state and becomes resistive. Typically, a noble metal is utilized for capping layer to prevent unwanted interaction between the stabilizer layer(s) and the superconductor layer. Typical noble metals include gold, silver, platinum, and palladium. Silver is typically used due to its cost and general accessibility. The capping layer is typically made to be thick enough to prevent unwanted diffusion of the components from the stabilizer layer into the superconductor layer, but is made to be generally thin for cost reasons (raw material and processing costs). Typical thicknesses of the capping layer range within about 0.1 to about 10.0 µm, such as 0.5 to about 5.0 µm. Various techniques may be used for deposition of the capping layer, including physical vapor deposition, such as DC magnetron sputtering.

The stabilizer layer is generally incorporated to overlie the superconductor layer, and in particular, overlie and directly contact the capping layer. The stabilizer layer functions as a protection/shunt layer to enhance stability against harsh environmental conditions and superconductivity quench. The layer is generally dense and thermally and electrically conductive, and functions to bypass electrical current in case of failure in the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically, sputtering, electroless plating, and electroplating. In this regard, the capping layer may function as a seed layer for deposition of copper thereon.

The resulting superconductor device may be utilized in numerous applications, such as commercial or industrial power equipment. The following examples are illustrative of the inventive superconductors of the present invention, but are not intended to be limiting.

Example 1

Formation of Porous Ceramic Films on Vicinal Substrates

As discussed above, the prior art has shown that the thin film microstructure (e.g. 0.2 µm or less) can be modified based on the film nucleation mechanism. For example, the island-type growth can be switched to a step-flow type of growth by employing vicinal substrates.

In this example, thin and thick vicinal HTS films were created using step-flow growth on substrates that have not undergone high-temperature pre-treatment, and the effects on $J_c$ were investigated. In particular, flat and vicinal YBCO films up to 3.0 µm in thickness on $SrTiO_3$ (STO) substrates were prepared. The thicknesses included 0.2, 0.5, 1.0, 1.5, 2.0, 2.5, and 3.0 µm. Pulsed laser deposition ("PLD") was employed to fabricate YBCO thick films on flat, 5°, 10°, and 15° miscut STO substrates (see FIG. 1) cut into squares of sides 2.5-5.0 mm, with a <100> axis aligned with one of the edges of the substrates. A Lambda Physik KrF excimer laser with λ=248 nm and pulse duration of 25 ns was used for deposition. The laser energy density was estimated to be 2-3 J/cm². The substrates were silver pasted to the heater and deposition was made at 810° C. in 400 millitorr oxygen partial pressure. After film deposition, the samples were annealed in situ at 520° C. for 45-60 minutes in 350 Ton of oxygen partial pressure. The deposition rate was about 0.6 Å/pulse at a 5 Hz repetition rate. To ensure a uniform deposition condition for the YBCO films of the same thickness, the flat and vicinal YBCO films were made in the same run by placing the substrates next to each other. For some thicknesses, several sets of flat and vicinal YBCO films were fabricated to confirm run-to-run reproducibility.

As discussed in the examples below, without the high-temperature pre-treatment of the vicinal substrates, the surface steps remain shallow during YBCO growth. In contrast to prior art films, no dislocation cores (columnar defects) were formed. Instead, the YBCO lattice appeared in tact except for the formation of pores.

Example 2

Film Structure and Morphology

In this example, the crystalline structure and phase purity of the superconducting films of Example 1 were investigated by using XRD, and surface morphology was analyzed using a LEO 1550 field-emission scanning electron microscope.

X-ray Diffraction.

All YBCO films grown on flat STO substrates have a c-axis orientation. When the miscut or vicinal substrates are employed, the c-axis of YBCO is supposedly tilted (see FIG.

Figure 2:
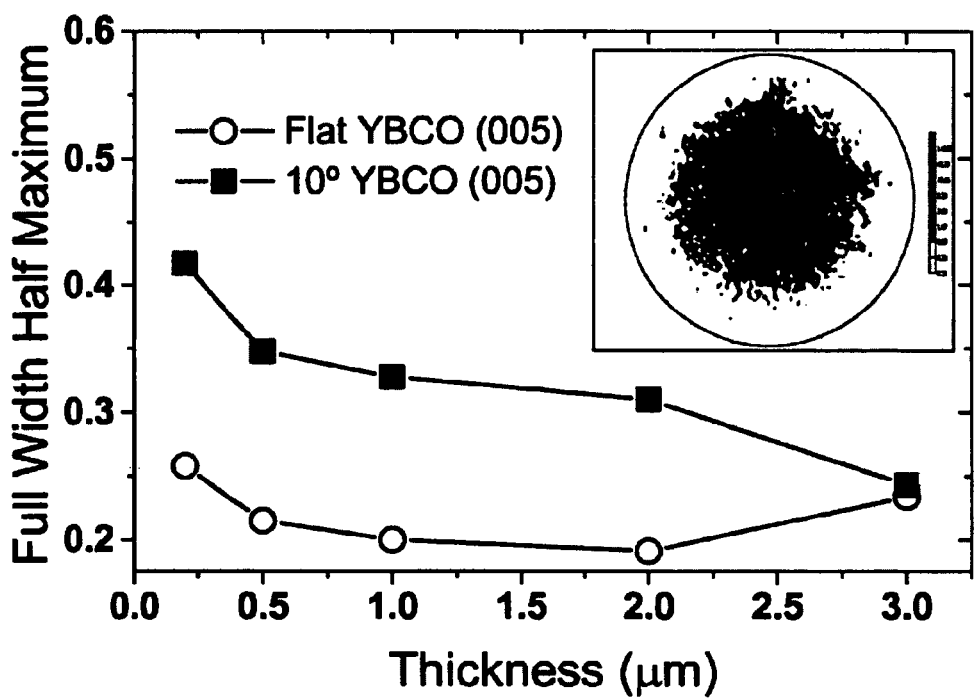
FIG. 2 shows the thickness dependence of the full width at half maximum of YBCO films deposited on flat and 10° miscut SrTiO$_3$ ("STO") at (005) peak. The inset shows the x-ray diffraction ("XRD") (005) pole figure of a 2.0-μm-thick YBCO film on 10° miscut STO. The split center pole is because of detector saturation and the extra four poles are due to the YBCO (104) reflections having the same d-spacing as (005). The figure shows a tilt of about 11°.

1) at a small miscut or vicinal angle $\theta_s$ with respect to the normal of the film. To confirm this, XRD pole figures and $\theta$-$2\theta$ scans were taken on vicinal samples of different thickness. The inset of FIG. 2 depicts an XRD (005) pole figure of a 2.0-μm-thick YBCO film on a 10° miscut STO substrate. Neither impurity nor misoriented YBCO phase were observed in the vicinal films. The tilt angle of about 10-11° was observed between the c-axis and the normal of the film for these samples. The observation of four (104) poles that are 90° apart confirmed epitaxy of YBCO films on the miscut substrates.

All YBCO films grown on flat STO substrates have a c-axis orientation as determined from the XRD $\theta$-$2\theta$ curves. At thicknesses of about 0.5 to 1.0 μm, no other peaks were visible suggesting only c-axis growth in this thickness range. In addition, no other impurity phases were visible from the XRD spectra in this thickness range. With increasing film thickness greater than 0.5 to 1.0 μm, the YBCO (200) peak appears, indicating the formation of a-axis oriented grains in thicker YBCO films on flat STO substrates. In addition, small volume portions of misoriented phases including (111) and (112) were also observed.

To quantify the out-of-plane texture evolution, (005) rocking curves ($\omega$-scan) were taken on five flat samples of 0.2, 0.5, 1.0, 2.0, and 3.0 μm thickness, respectively. The FWHM of the (005) $\omega$-scan of flat YBCO films is shown as function of thickness in FIGS. 2 and 3. Qualitatively, a similar monotonic decrease of the FWHM with increasing thickness was observed while quantitatively the (005) FWHM values are slightly higher in the vicinal YBCO films than that of the flat ones at the same thickness. For example, the FWHM of the vicinal film is 0.43° at 0.2 μm thickness and decreased to 0.31° at 2.0 μm thickness. This likely occurs because of the large strain induced in vicinal YBCO films when the lattice is slightly tilted with respect to the substrate normal. At larger thickness of 3.0 μm, the FWHM continue to decrease to about 0.25°, which is comparable to that of flat YBCO films of the same thickness. This means that the out-of-plane grain alignment continues to improve with increasing thickness up to about 3.0 μm. If this trend continues beyond 3.0 μm thickness, it is anticipated that better out-of-plane grain alignment should be obtained in vicinal YBCO films.

For the films formed on flat substrates, at the 0.2 μm film thickness, the FWHM has the maximum value of 0.26°, and experienced a monotonic decrease with increasing thickness to the minimum value of 0.19° at 2.0 μm film thickness, followed by an upturn to 0.24° at 3.0 μm. This more or less constant FWHM values in the thickness range of 0.5 μm to 3.0 μm suggests that the microstructural degradation in flat YBCO films manifests mostly in the form of misoriented grains, which have large angle grain boundaries ("GBs") with the c-axis oriented YBCO matrix and obstruct $I_c$.

Figure 3:
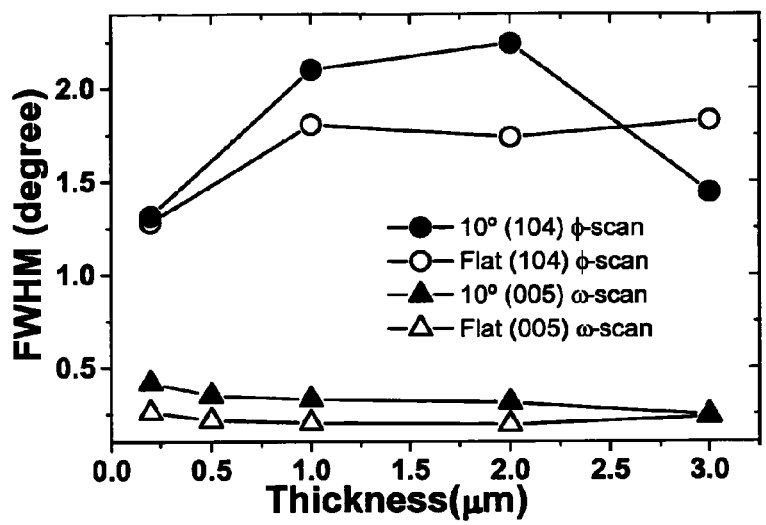
FIG. 3 shows the full width at half maxima ("FWHM") values of XRD (104) φ-scans (circles) and (005) ω-scales (triangles) measured on flat (open symbols) and 10° vicinal (solid symbols) YBCO films with thickness in the range of 0.2 μm to 3.0 μm.

FIG. 3 also shows the in-plane texture evolution as function of thickness characterized using (104) $\phi$-scans. The FWHM of the (104) peak is shown as function of film thickness for both flat (open circles) and vicinal (solid circles) samples. Overall, the in-plane FWHM value is higher than the out-of-plane one by a factor of 2-10. On flat samples, the (104) FWHM value increased from about 1.2° at 0.2 μm thickness to 1.7° at 1.0 μm thickness and remained approximately a constant at larger thickness. The (104) FWHM on the vicinal samples took a similar trend, despite a slightly higher value, in smaller thickness up to 2.0 μm thickness, which was followed by a drop at 3.0 μm thickness. In fact, smaller out-of-plane misorientation was observed in vicinal YBCO film at this thickness. This difference may be attributed to the different patterns in nucleation occurring in the flat and vicinal YBCO films. As mentioned earlier, the flat YBCO film nucleates via a spiral island-type mode while the vicinal film, step-flow mode.

Scanning Electron Micrographs

Figure 4:
FIG. 4 shows SEM pictures of YBCO films deposited on STO substrates with different miscut angles. The columns show the progression (from left to right) with respect to miscut angle namely: flat, 5°, 10°, and 15° while the rows differ with respect to film thickness. Top row: 0.2 μm thick YBCO films on (a) flat, (b) 5°, (c) 10°, and (d) 15° miscut STO. Middle row: 1.5 μm thick YBCO films on (e) flat, (f) 5°, (g) 10°, and (h) 15° miscut STO. Bottom row: 3.0 μm thick YBCO films on (i) flat, (j) 5°, (k) 10°, and (l) 15° miscut STO.
Figure 5:
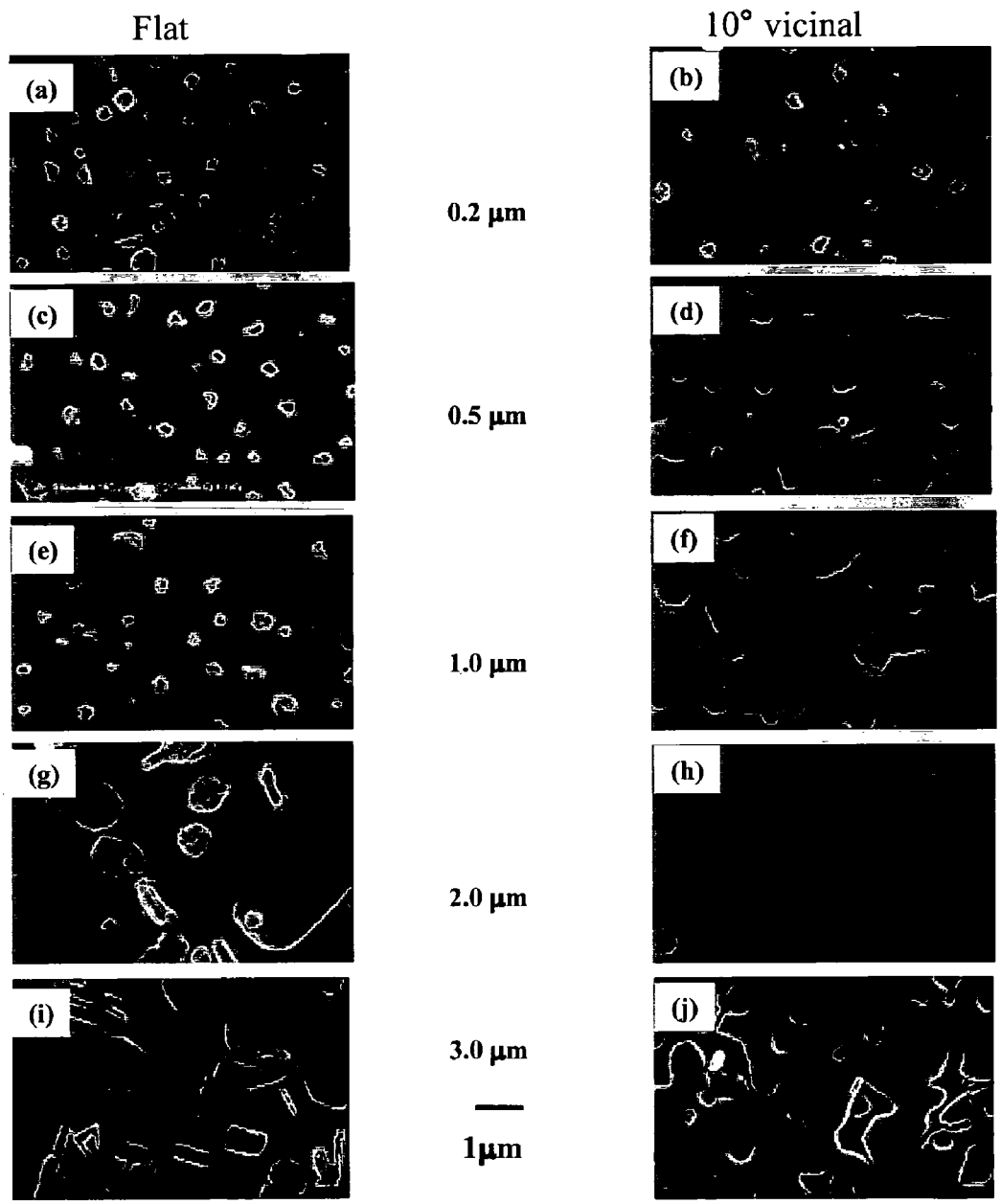
FIG. 5 is SEM pictures of YBCO films deposited on flat (left column) and 10° miscut (right column) STO substrates. The rows show the progression (from top to bottom) with respect to film thickness. Top row: 0.2 μm thick YBCO films on (a) flat and (b) 10° miscut STO. Second row: 0.5 μm thick YBCO films on (c) flat and (d) 10° miscut STO. Third row: 1.0 μm thick YBCO films on (e) flat and (f) 10° miscut STO. Fourth row: 2.0 μm thick YBCO films on (g) flat and (h) 10° miscut STO. Fifth row: 3.0 μm thick YBCO films on (i) flat and (j) 10° miscut STO.

To understand how microstructure evolved in the flat and vicinal YBCO films, the film surface morphology was analyzed using SEM. FIGS. 4 and 5 show that the two YBCO film sets experienced dramatically different characteristics of microstructural evolution.

FIG. 4 compares surface morphology of flat, 5°, 10°, and 15° vicinal YBCO films at three thicknesses: 0.2, 1.5, and 3.0 μm. At small thicknesses, such as 0.2 μm (the top row of FIG. 4), the steps are clearly seen and the density of the steps increases with increasing miscut angle from 5° to 15°. In addition, spherical pores of typically submicron dimension are visible on all vicinal films at small thickness. Surprisingly, pores also formed at larger film thicknesses. The pores were not just surface features but were "tube-like" and formed at 30 to 50 nm from the film/substrate interface and ran through several micron thickness. This surprising result may directly relate to the stacking faults due to strain release at certain thickness. At small thickness of about 0.2 μm, particulates that are typical to the PLD YBCO films are visible on all films, whether flat or vicinal, while the density of the particulates is higher on flat YBCO films. With increasing film thickness, the surface morphology of the YBCO films experienced distinctly different evolution on flat and miscut substrates. On flat STO, the particulates grew from sub-micron size to micron-sized when the thickness was increased to about 3.0 μm. Although the flat films look dense, the surface morphology became extremely rough and misoriented rectangular shaped (a-axis) grains are visible. On thick vicinal YBCO films, on the other hand, most particulates disappeared while the film become increasingly porous. At 1.5 μm thickness, as shown in the middle row of FIG. 4, microsize rectangular shaped pores become a distinctive feature on vicinal films in addition to the small spherical pores. The long side of these rectangular pores is either perpendicular or parallel to the steps. Some of them are connected to form a right angle pore. The density of these rectangular shaped pores is higher on YBCO films grown on a larger miscut angle substrate, while that of small spherical pores take an opposite trend. Nevertheless, steps are still visible on most of the film while the step width increased by 50% to 100%. When the thickness is further increased to 3.0 μm, a "melted cheese" type of surface morphology was observed on vicinal YBCO films (see the bottom row of FIG. 4). Large sized pores of irregular shapes are visible over the film surface and the grain size decreases with increasing miscut angle. On low angle miscut substrates, e.g., 5° miscut STO, there are still many small spherical pores at the 3.0 μm-thick YBCO films. With increasing miscut angle, the density of the small circular pores reduces dramatically, and on 15° miscut substrates, few can be seen. Steps are barely visible on 3.0 μm-thick vicinal YBCO films. The only exception is 15° vicinal YBCO films, on which fat steps of width around 1.0 μm can still be observed.

FIG. 5 is another illustrative set of SEMs, some of which are also contained in FIG. 4. FIG. 5 shows two sets of SEM micrographs taken on YBCO films of 0.2, 0.5, 1.0, 2.0, and 3.0 μm thickness on flat (left column) and 10° miscut (right column) STO substrates, respectively. As with FIG. 4, the two YBCO film sets experienced dramatically different characteristics of microstructural evolution. On flat STO, all films look dense, despite an increasingly rougher surface morphology at larger film thickness.

As alluded above, two factors contributed to the surface roughness of the flat YBCO films at large thickness. The first one is the particulate, which dimension increased from submicron to about 1.0 μm when the film thickness was increased from 0.2 μm to 3.0 μm. The other is the misoriented YBCO phases shown as rectangular bars (representing sides of plates) and other shaped features on the surface of the flat YBCO films when the film thickness is near or above 1.0 μm. This is consistent with the appearance of the misoriented phases in the flat YBCO films with thickness greater than 0.5 μm in XRD analysis. The density and volume fraction of these misoriented phases increase with film thickness. In the case of miscut substrates, the YBCO films followed step-flow growth characteristics as evidenced by the observed atomic steps on films with thicknesses up to 2.0 μm in the right column of FIG. 5. Particulates with a much lower density can also be seen at 0.2 μm thickness but they are barely observable at larger thickness, in sharp contrast to the flat YBCO film case.

In addition, no misoriented grains were visible on the surface of the vicinal films, consistent with the XRD data discussed earlier. A distinctive difference between the flat and vicinal YBCO films is that the latter are highly porous when the thickness is greater than 0.5 μm. Even at 0.2 μm thickness, holes of a circular shape are already visible with dimension of tens to hundreds of nanometers. With increasing thickness, both the shape and density of the pores vary and becoming tube-like. Starting from about 0.5 μm to 0.6 μm thickness, circular and rectangular shaped (or dog-bone shaped) pores become a distinctive feature. The sides of most rectangular pores are either perpendicular or parallel to the steps, suggesting that the strain built through vicinal film may contribute dominantly to the formation of the pores. Some of the rectangle pores connected to form a straight angle pores. Nevertheless, steps are still visible on most part of the film while the step width increased by 50-100% from 0.2 μm to 2.0 μm thickness. When the film thickness is further increased, a melted-cheese type of surface morphology was observed on the vicinal YBCO films (see FIG. 5j). Large irregular shaped pores were visible all over the film while steps disappeared nearly completely.

The appearance of pores in vicinal YBCO films most probably relates to the strain induced in the tilt YBCO crystal lattice. This strain may cause lattice distortion, resulting in higher in-plane and out-of-plane misorientations as suggested in the XRD analysis (FIG. 3). In addition, the transmission electron microscopy ("TEM") study of the vicinal YBCO films shows antiphase grain boundaries formed at the film/substrate interface annihilate after several monolayers and terminate into stacking faults, instead of forming dislocation cores reported in vicinal films grown on the pre-treated vicinal substrates. At larger thickness above the stacking faults are formed, the YBCO lattice looks in tact, which supports the strain hypothesis. Although the exact mechanism for the pore formation is still under investigation, the release of the local strain on the lattice at larger thicknesses has been confirmed in both TEM study and SEM study in combination with ion milling. The strain seems reduced significantly at large thickness above 2.0 μm when a large number of pores form so that both the in-plane and out-of-plane misorientations reduced accordingly. Interestingly, this was accompanied with disappearance of the $J_c$ anisotropy as discussed in the MOI experiments below.

Example 3

Magnetic characterization of $T_c$ and $J_c$

In this example, the superconducting properties of the YBCO films were magnetically characterized in a SQUID magnetometer (Quantum Design) with the external magnetic field (H) applied normal to the film surface. Magnetization (M) vs. temperature (T) curves measured on heating in 1.0 mT field after zero-field cooling to 10 K were used to determine the superconducting transition temperature ($T_c$). M vs. H loops were taken at different temperatures between 60 K and 85 K for evaluation of the $J_c$. The Bean model was applied for calculation of the $J_c$ using the overall film dimensions. See C. P. Bean, Rev. Mod. Phys. 36, 31 (1964), which is incorporated by reference. Importantly, the $J_c$ values obtained this way are typically lower than the $J_c$ values measured using electrical transport method due to different criteria applied to the two methods. On vicinal samples, the latter measurement has been made recently and higher values of $J_c$ have been confirmed. $J_c$ in the vicinal YBCO films is anisotropic with higher $J_c$ value observed along the surface steps (longitudinal direction). The magnetic $J_c$ measurement detects only the lower $J_c$ (transversion direction perpendicular steps). Much high values of $J_c$ along the longitudinal direction has been confirmed in the magneto-optical imaging study as well as in the transport study recently on vicinal films.

The zero-field-cool M-T curves were measured on both sets of YBCO films to determine their $T_c$. The YBCO films on both flat and miscut substrates showed uniform superconducting transitions even though the film thickness was varied by an order of magnitude. The $T_c$ values for both flat and vicinal YBCO samples are in the range of 87.8-88.5 K. These slightly lower $T_c$ values than the ones typically reported for YBCO films were due to an offset of about −1.0 K in the temperature sensor of our magnetometer. The observed uniformity in $T_c$ suggests that the variation in the processing condition for YBCO films was insignificant with increasing film thickness.

Figure 6:
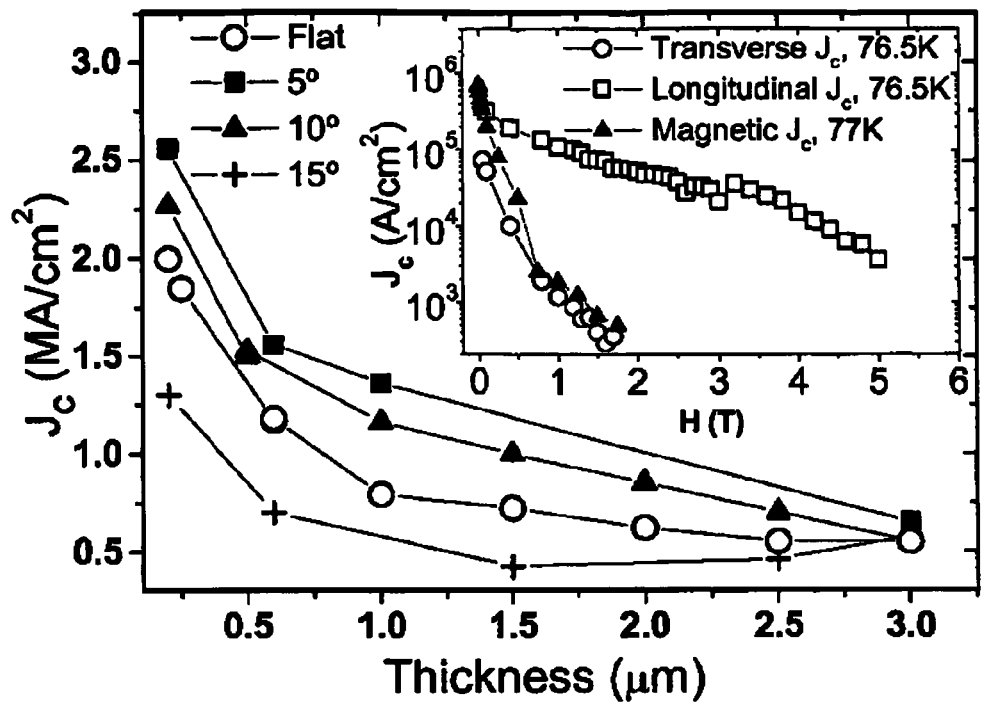
FIG. 6 shows the $J_c$-thickness curves for YBCO films deposited on STO substrates with different miscut angles. The inset shows a comparison of magnetic and transport $J_c$ of a 0.6 μm YBCO film on 15° miscut STO substrate.
Figure 7:
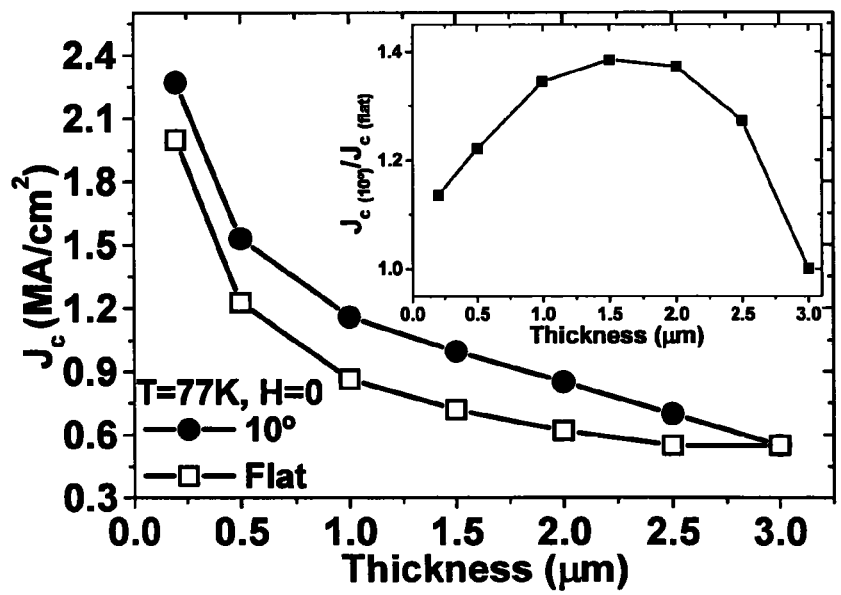
FIG. 7 shows the $J_c$-thickness curves for YBCO films deposited on flat (open squares) and 10° miscut (solid circles) STO substrates at 77 K and SF. The relative enhancement of the $J_c$ in 10° vicinal YBCO films, defined as $J_c(10°)/J_c(\text{flat})$, is plotted in the inset as function of film thickness.

FIGS. 6 and 7 show a comparison of the $J_c$-t curves measured magnetically on flat and vicinal YBCO films. As shown in FIG. 6, over the thickness investigated, the 5° and 10° vicinal YBCO films carry higher $J_c$ values than YBCO films on flat STO, while the 15° vicinal YBCO films have the lowest $J_c$ overall. At 0.2 μm thickness, 4 in the 5° vicinal YBCO film is about 2.6 MA/cm² at 77 K and self-field, about 20% higher than that of the flat YBCO film. At 1.0 μm thickness, this difference increased to the maximum value of 115%. This means that the $J_c$ values on the 5° and 10° vicinal YBCO films not only are higher but also decrease more slowly with film thickness from thin to 1.0 μm thickness than that of the flat YBCO films.

It should be realized that $J_c$ values are anisotropic in vicinal YBCO films along the direction parallel or perpendicular to the steps. The anisotropy increases with vicinal angles and the magnetically measured $J_c$ values shown in FIG. 6 represent the lower $J_c$ along the direction perpendicular to the steps— that is, a value closer to the lower transverse $J_c$ component ($J_{cT}$) of the current loop in the vicinal films. For a thin film sample of square dimensions a×a with anisotropic $J_{cL} < J_{cT}$, the apparent critical current density, $J_{c,app}$, obtained by application of the standard Bean model to the measured magnetization hysteresis, $\Delta M$, is given by, $J_{c,app} = J_{cT}(3 - J_{cT}/J_{CL})/2$.

The inset of FIG. 6 compares the magnetic and transport $J_c$ values measured on the same 15° vicinal YBCO film of 0.6 μm thickness. After the film has been magnetically characterized, two perpendicular microbridges (20×500 μm²) with one along the longitudinal (parallel to the steps) and the other along the transverse (perpendicular to the steps) directions were patterned on the film. About 1 μV/cm was applied to define $J_c$. The transverse transport $J_{cT}$ was confirmed to be consistent with the magnetic $J_c$ measured on the same sample before lithography while the longitudinal transport $J_c$ was much higher. This means that that much higher $J_c$ values along the longitudinal direction are expected on vicinal YBCO films.

The inset of FIG. 7 depicts the relative improvement of $J_c$ in 10° vicinal YBCO films as opposed to their flat counterparts at different thickness. The curve looks more or less like a bell. Starting from about 16% improvement at small thickness of 0.2 μm, the $J_c$ improvement reached a maximum value of about 46% at 1.0 μm thickness, followed by monotonic decrease to about 28% at 2.5 μm thickness. At 3.0 μm thickness, the vicinal and flat YBCO films have nearly the same $J_c$.

Example 4

Magneto-Optical Imaging

To investigate the $J_c$ anisotropy, magneto-optical (MO) characterization was performed using a bi-doped magneto-optical garnet film with in-plane magnetization grown on Gadolinium Gallium Garnet substrates. See Polyanskii et al., *Nano-crystalline and Thin Film Magnetic Oxides* (NATO Science Series 3. High Technology-Vol. 72), Edited by I. Nedkov and M. Ausloos, p. 353-370, 1999 Kluwer Academic Publishers; Polyanskii et al., *Magneto-Optical characterization techniques*, Chapter C3.4 of Handbook of Superconducting Materials, Ed. D. Cardwell, University of Cambridge, UK; D. Ginley, NREL. IOP publishing Ltd 2003, p. 1551-1567. The sample was mounted on a cold finger of a continuous flow optical cryostat capable of cooling to about 6 K located on an X-Y stage of a polarized optical microscope in reflective mode. A silicone heat sink compound created a tight temperature contact between the bottom face of the sample and the cold finger. To register the normal component of the magnetic flux distribution $H_z$ on the sample surface the indicator film was placed on the top sample face without any restraint. A silicon diode and the LakeShore temperature controller adjusted the sample temperature. The external magnetic field was applied perpendicular to the film plane by a small solenoid surrounding the cold finger. A digital camera was used to record the magneto-optical images. A deconvolution procedure was used, see Perkins et al., *Deconvolution of 2D transport currents from the local magnetic field distribution above flat superconducting samples*, Supercond. Sci. Technol. 15 1140-1146 (2002), as well as the measurements of depth of flux penetration into films to calculate the $J_c$ distribution and its anisotropy in flat and vicinal samples. See Brandt and Indenbom. Phys. Rev. B 48, 12, 893 (1993); Polyanskii et al., *Magneto-optical study of flux penetration and critical current densities in [001] tilt $YBa_2Cu_3O_{7-\delta}$ thin-film bicrystals*, Phys. Rev. 53, 13, 8687 (1996).

Figure 8A:
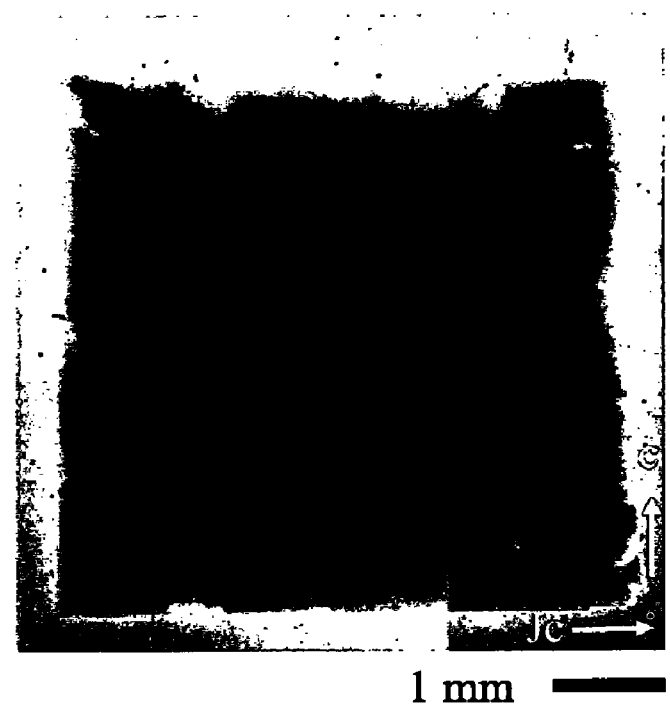
FIG. 8 shows magneto-optical ("MO") images of flux behavior in the 0.2 μm thick flat (a) and 10° miscut (b) YBCO samples taken at temperatures T=10 K. 2w is the sample width, 2b is the width of flux-free Meissner region and $P_L$ and $P_T$ are the depths of flux penetration perpendicular and parallel to the steps of growth, respectively. Zero field cooling ("ZFC") regime has been used at T=10 K and: (a) H=80 mT; and (b) H=28 mT. The symmetric roof patterns of flux penetration with well-developed diagonal d-lines, where current change direction on 90°, are well visible in dark contrast.

A set of flat and 10° vicinal YBCO films with thickness of 0.2, 0.5, 1.0, 2.0, and 3.0 μm were used for MO imaging at temperature range 10 K-80 K and H fields as high as 120 mT. Anisotropy of the $J_c$ was confirmed on 10° vicinal films. FIGS. 8 and 9 present the MO images taken at T=10 K and 60 K, respectively, on a flat and a 10° vicinal YBCO film with the thickness of 0.2 μm. The flat sample (FIG. 8(a)) has quite uniform superconducting properties everywhere around the sample. In homogeneous superconductors of a square or rectangular shapes, magnetic flux starts penetrating at the middle of the sample edges and forms a "roof" pattern with well-developed diagonal lines (discontinuity d-line). These lines are well visible on MO image in FIG. 8(a) in dark color contrast when H field was increased to 80 mT. The flux carrying regions have the bright contrast. The dark square at the center of the sample expels the external magnetic field and only Meissner current circulates in this area. The behavior of magnetic flux in the flat sample is well described by the Bean model.

Figure 8B:
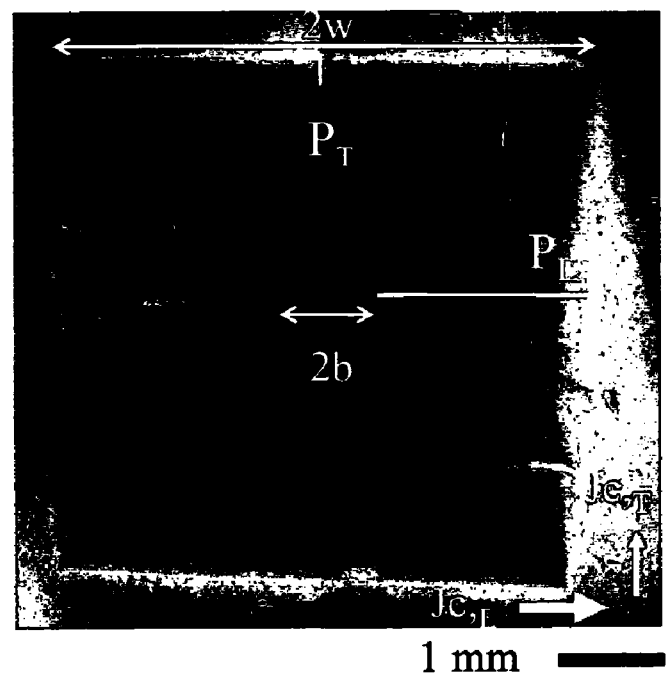

In contrast to the flat samples, the 10° vicinal YBCO sample showed in the ZFC regime a very anisotropic flux penetration along and perpendicular to the steps of growth on miscut substrate at H=mT (FIG. 8(b)). The magnetic flux penetrates more easily along the $P_L$ direction due to the anisotropic pinning force of parallel oriented planar antiphase boundaries generated in vicinal films during epitaxial growth and exhibits a specific filamentary pattern. These defects are strong pinning centers transverse to the boundaries and the $J_{c,T}$ is smaller than the $J_c$ in the flat film. It is clearly seen in FIG. 8(b) that the magnetic flux penetrates into the sample along $P_L$ direction deeper, than in flat sample, even at lower field H=28 mT.

Figure 9A:
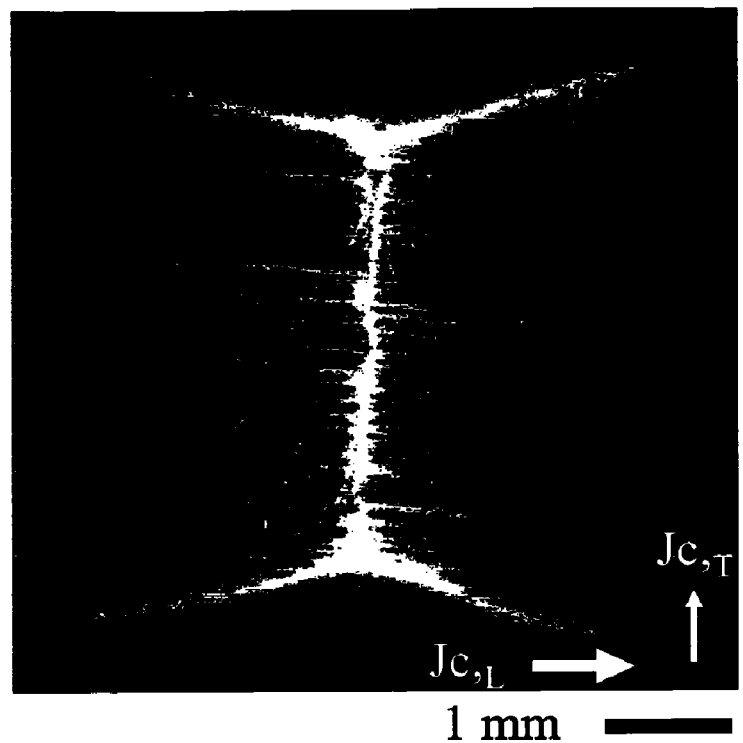
FIG. 9 shows MO images of flux behavior in the 0.2 μm thick 10° vicinal YBCO samples taken at temperatures (a) 10 K and (b) 60 K. Remnant state was obtained after cooling down in H=120 mT. Additional to the symmetric roof patterns visible in bright contrast the filamentary picture of flux penetration exists at T=10 K (a).
Figure 9B:
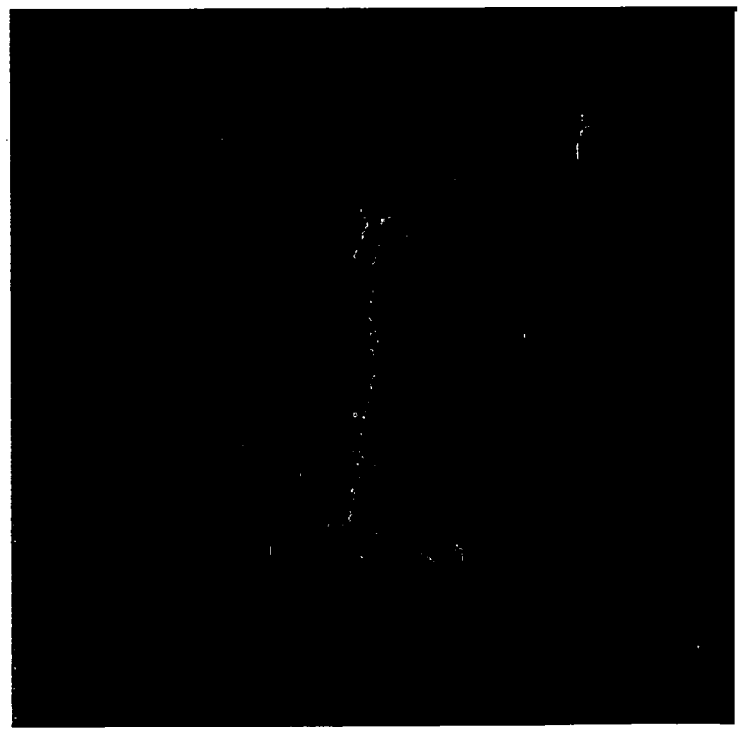

FIGS. 9(a) and 9(b) show magnetic flux behavior in the 10° vicinal sample in remnant state at 10 K and 60 K, respectively, when external field was reduced from 120 mT to zero. The filamentary pattern on MO image is more remarkable at the lower temperature in the remnant state. The filamentary flux pattern and a few macroscopic sphenoid defects are also better seen than in ZFC state in FIG. 8(b). This filamentary flux pattern has also been observed early and connected with variations in the structural width of parallel oriented planar antiphase boundaries. With increasing temperature to 60 K and higher, the MO images showed that the anisotropy of flux penetration is slowly decreasing and the apex angle is changing from 150° at T=10 K to 125° at T=60 K and further to 118° at T=77 K. At T=60 K the filamentary pattern and sphenoid defects are hardly visible.

Figure 10A:
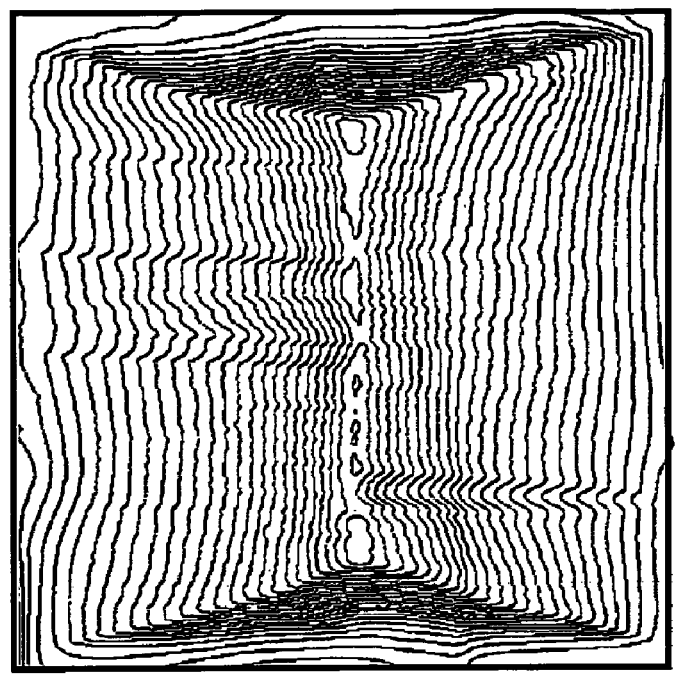
FIG. 10(a) shows the contours of the magnetization current streamlines and FIG. 10(b) is the current distribution map calculated by deconvolution procedure for MO image of the same sample in FIG. 9(a) in remnant state. The diagonal d-lines exist where current turns on 90°.
Figure 10B:
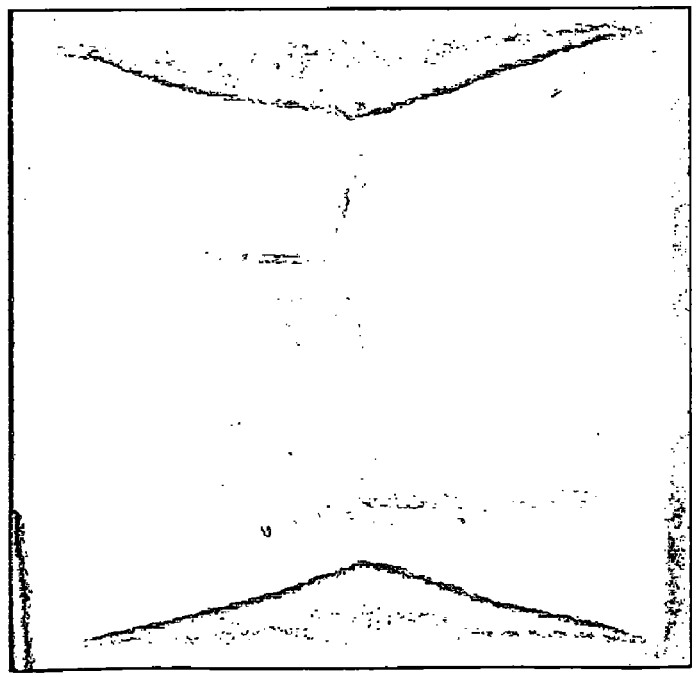

FIGS. 10(a) and 10(b) show the streamlines and map of magnetization current extracted by deconvolution procedure. The calculated images confirmed a very anisotropic current distribution in the vicinal film. The streamlines are much dense in direction of the growth steps and consequently the $J_{c,L}$ is much larger than $J_{c,T}$. As seen in FIG. 10(a) the streamlines of magnetization current flow uniformly along all edges of sample and change direction on 90° directly on the d-lines where the strong contrast appears on magneto-optical images.

The map of current distribution shows different intensity contrasts, which reflect the values of $I_c$ flowing parallel and perpendicular to growth steps. The segments on the top and bottom of the image are brighter than in the direction perpendicular to steps of growth. The intensity of contrast ratio reflects the anisotropy of critical current. The $J_{c,L}$ is about 3.5 times higher than the $J_{c,T}$ and this ratio.

In contrast to the vicinal sample, the streamlines and map of magnetization current extracted by deconvolution procedure in the flat sample show uniform value of the current distribution around the sample. The uniform flux penetration in the flat sample does not change very much with increasing temperature to 77 K and the apex angle of 90° between diagonals remained the same at a wide temperature range. At T=80 K, the shape of roof pattern has slightly non-uniformity of current distribution.

To study the temperature and field dependences of the critical current on flat and 10° vicinal samples with different thickness the lengths of the flux penetration P from edges of flat and 10° vicinal YBCO samples, as well the 2b width, were measured (see FIG. 8(b)). The anisotropy, absolute value and temperature dependence of $J_c$ in ZFC and FC regimes was extracted using the procedure well described in Brandt and Indenbom. Phys. Rev. B 48, 12, 893 (1993); Polyanskii et al., *Magneto-optical study of flux penetration and critical current densities in [001] tilt $YBa_2Cu_3O_{7-\delta}$ thin-film bicrystals*, Phys.

Rev. B 53, 13, 8687 (1996). The procedure is based on the equation (3) in Polyanskii: $b(Ba)=w/\cosh(Ba/B_0)$. Here 2b is the width of a vortex-free region so-called Meissner area, 2w is the width of sample in the direction of flux penetration (see FIG. 8(b)), Ba is the external magnetic field and $B_0=\mu_0 J_c d/\pi$ is the characteristic field of full flux penetration. By inverting Eq. (3) under the assumption that there is no field dependence of $J_c$ in the low magnetic field range less than 120 mT the expression for calculation of $J_c$ has been received: $J_c=\pi Ba/d\mu_0 \operatorname{acosh}[w/b(Ba)]$, where d is the thickness of the YBCO film. To get the T-dependence of $J_c$, 2b was measured at several T and H values.

It was shown that $J_c$ does not depend on H in T-range of 8 K-80 K, when H is less than the field of full flux penetration $B_0$. At low T, the $B_0$ is 120 mT. The same observations were made at T around 77-80 K, where the maximum H of 10-20 mT was less than $B_0$. By plotting Ba versus acosh [w/b(Ba)], the equation $\pi Ba=J_c d\mu_0 \operatorname{acosh}[w/b(Ba)]$ has a constant slope at each T. As seen from this equation, each slope is proportional the critical current $J_c$ at the given T.

Figure 11:
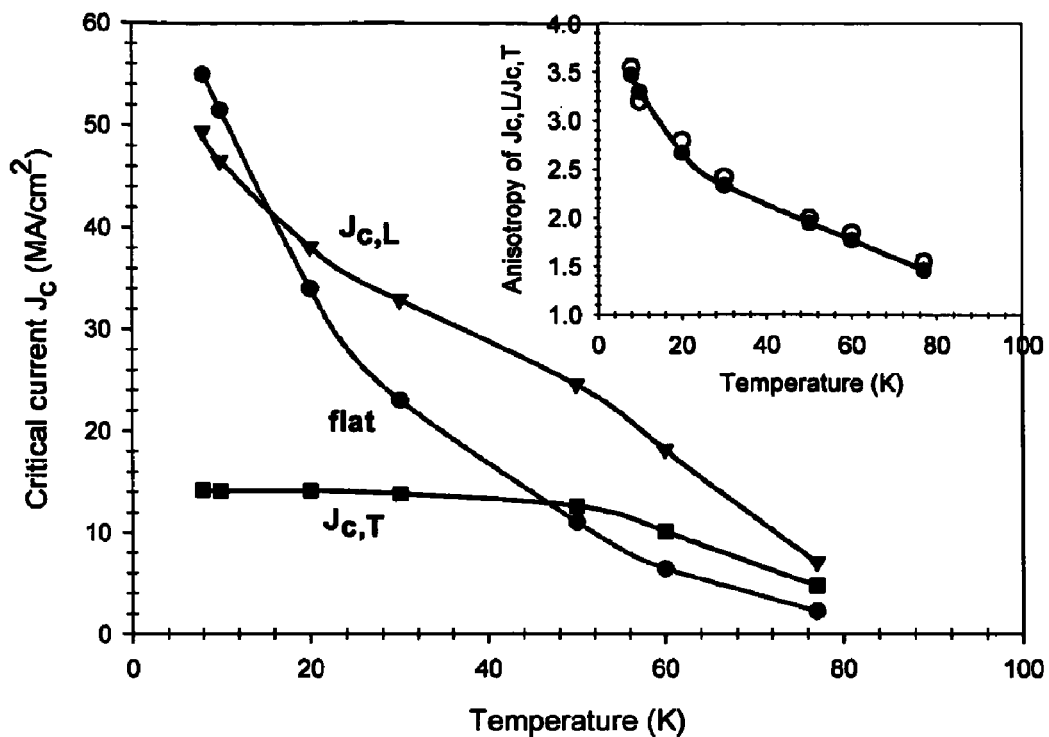
FIG. 11 shows the temperature-dependence of $J_c$ values in the 0.2 μm thick flat and 10°-vicinal YBCO samples. $J_{c,L}$ and $J_{c,T}$ are critical currents along and transverse directions of steps of growth in vicinal YBCO sample. The inset shows the T-dependence of the $J_c$ anisotropy ($J_{c,L}/J_{c,T}$) in the vicinal sample calculated in ZFC (solid) and FC (open) modes.

FIG. 11 presents the temperature-dependence of $J_c$ in the 0.2 μm thick flat and 10° vicinal YBCO samples calculated according to the above described procedure using MO images taken in T-range of 10-80 K. As seen from the plot the $J_{c,L}$ (closed triangles) is much higher than the $J_{c,T}$ (closed squares), but in the flat sample (closed circles) the $J_c$ has values even higher than $J_{c,L}$ at low temperatures <15 K. However, with increasing temperature the $J_c$ of flat sample decreases faster and becomes lower than $J_{c,L}$ and even lower than $J_{c,T}$ at T≧50K. The plot of the anisotropy of $J_c$ in the 10° vicinal YBCO sample with 0.2 μm thicknesses is shown as function of T in the inset of FIG. 11. The solid circles are the MO experimental data in ZFC regime and the open circles, the calculated ratio of $P_L/P_T$ in remnant mode. Both measurements show the same results, namely the influence of the growth steps is slowly disappearing with increasing temperature. Similar behaviors of $J_c$-T and $J_c$ anisotropy versus T were also observed on the 0.5 μm thick flat and 10° vicinal YBCO samples where only the absolute values of the $J_c$ for both samples were less than in 0.2 μm thick ones.

Figure 12:
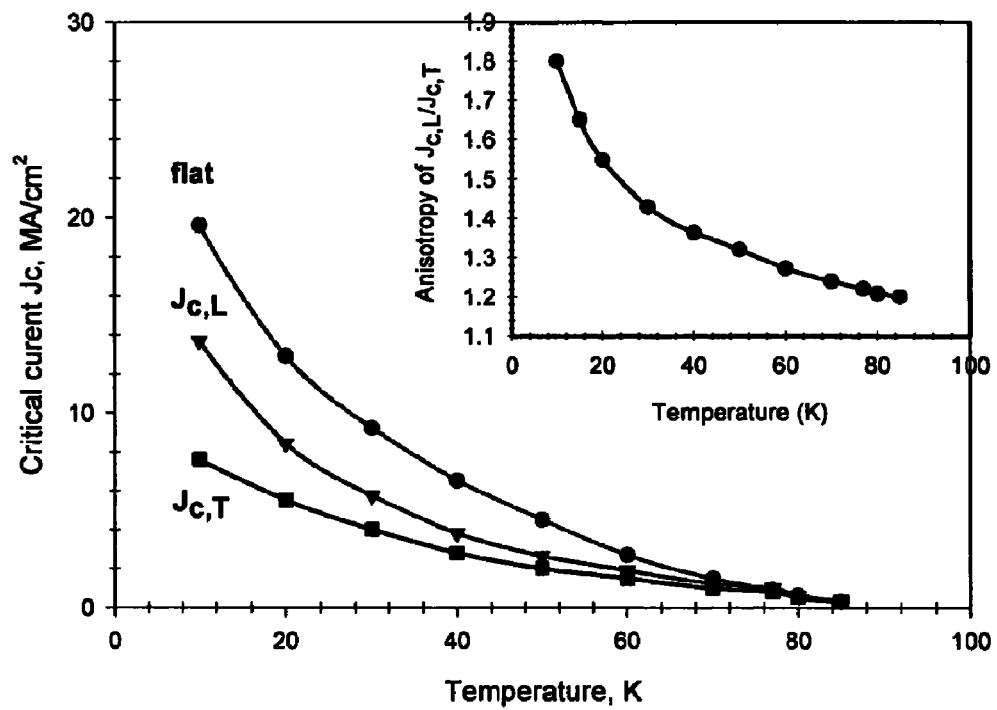
FIG. 12 shows the T-dependence of $J_c$ values in the 2.0 μm thick flat and 10° vicinal YBCO samples. The inset shows the T-dependence of the $J_c$ anisotropy ($J_{c,L}/J_{c,T}$) in this vicinal sample. The anisotropy of $J_c$ was calculated in ZFC.
Figure 13:
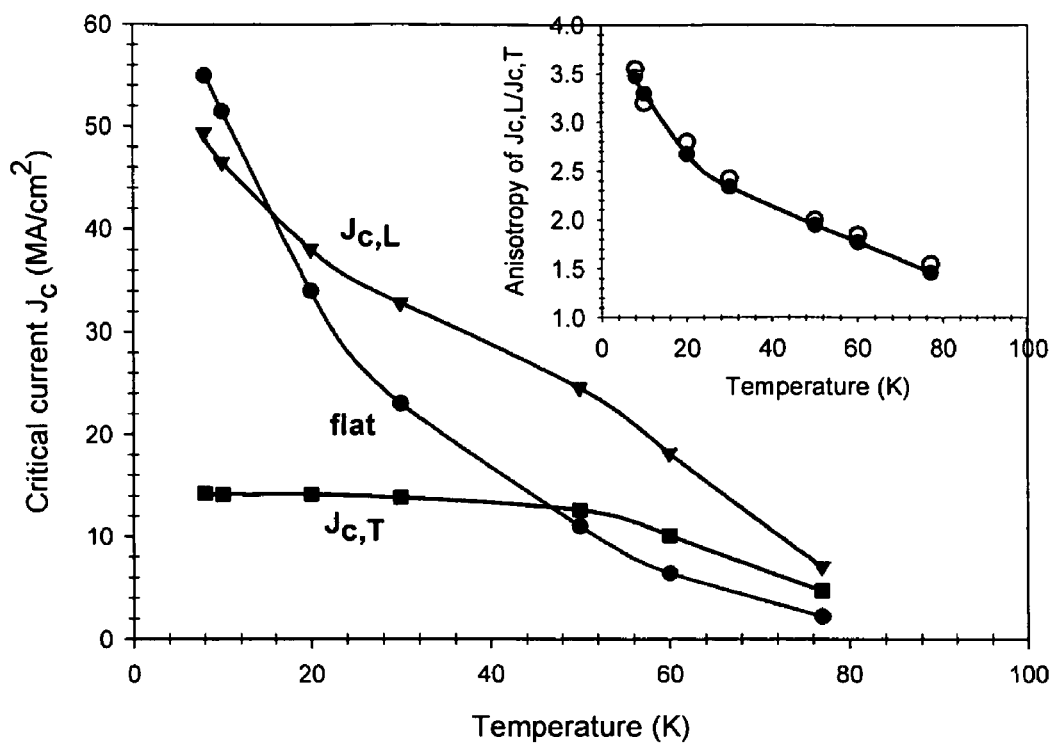
FIG. 13 shows the T-dependence of $J_c$ values in the 3.0 μm thick flat and 10° vicinal YBCO films. The 3.0 μm thick 10°-vicinal sample does not show any remarkable anisotropy and $J_{c,L}=J_{c,T}$.
Figure 14A:
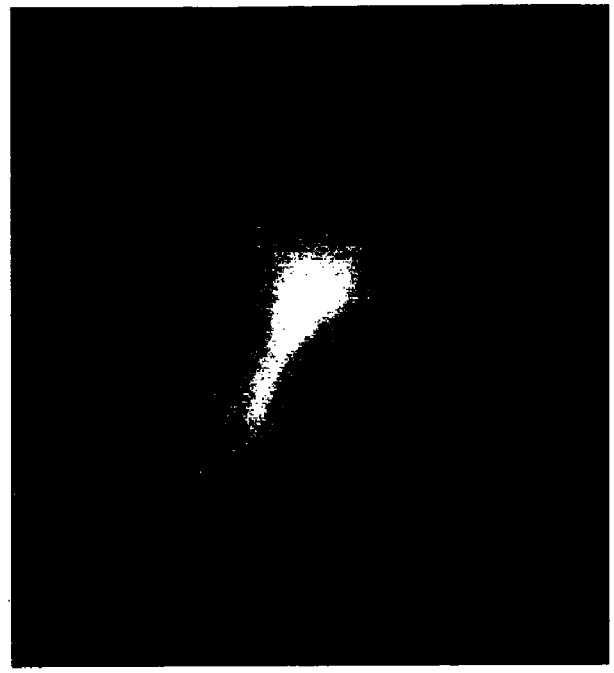
FIG. 14 are MO images of flux behavior in the 3.0 μm thick 10° vicinal YBCO samples taken at (a) T=10 K and (b) T=77 K. Remnant state was obtained after cooling down in H=120 mT.
Figure 14B:
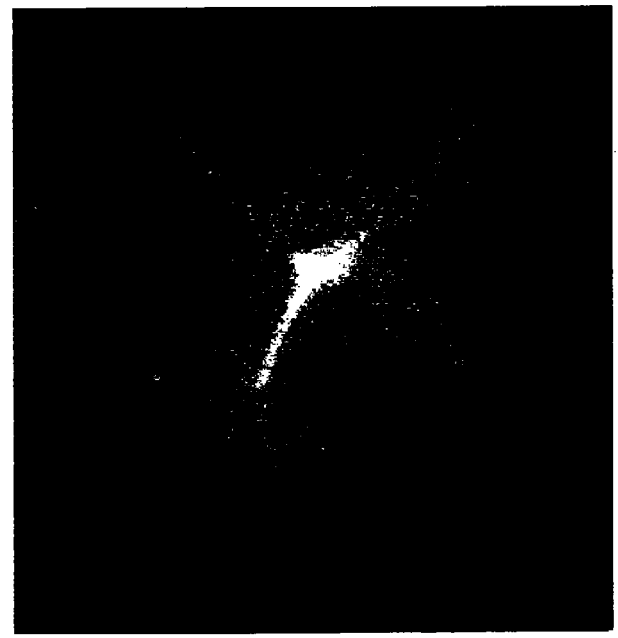

In the samples with thickness 2.0 μm or greater the $J_c$ in flat sample is higher than $J_{c,L}$ and $J_{c,T}$ in vicinal sample in the whole T range of 10-77 K. FIGS. 12 and 13 show, respectively, the data taken on the 2.0 μm and 3.0 μm thick samples (symbols are the same as in FIG. 11). The $J_{c,L}$ and $J_{c,T}$ in the 2.0 μm thick vicinal YBCO sample are still different, but both are lower than the $J_c$ in the flat sample (FIG. 12). The anisotropy (the inset of FIG. 12) has the same tendency with absolute value less than that in thinner samples. At the 3.0 μm thickness, the $J_c$ anisotropy diminishes completely in the vicinal sample (FIG. 13). The MO images in FIGS. 14(a) and 14(b) taken on the 10° vicinal film with 3.0 μm thickness demonstrate no influence of steps of growth at T=10 K and 77 K, respectively. The apex angles between diagonal d-lines of the roof pattern in both images are 90°.

Figure 15A:
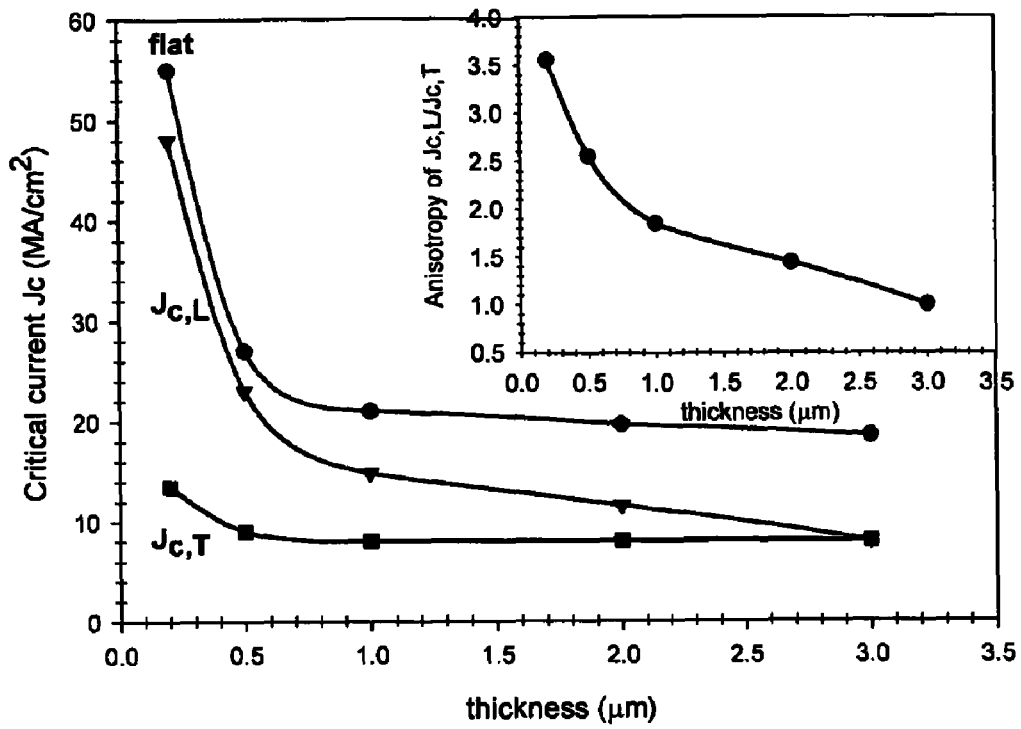
FIG. 15 shows the thickness dependence of $J_c$s in flat and 10° vicinal YBCO samples taken at T=10 K (a) and T=77 K (b). The inset shows the thickness dependence of the $J_c$ anisotropy ($J_{c,L}/J_{c,T}$) in vicinal YBCO samples.
Figure 15B:
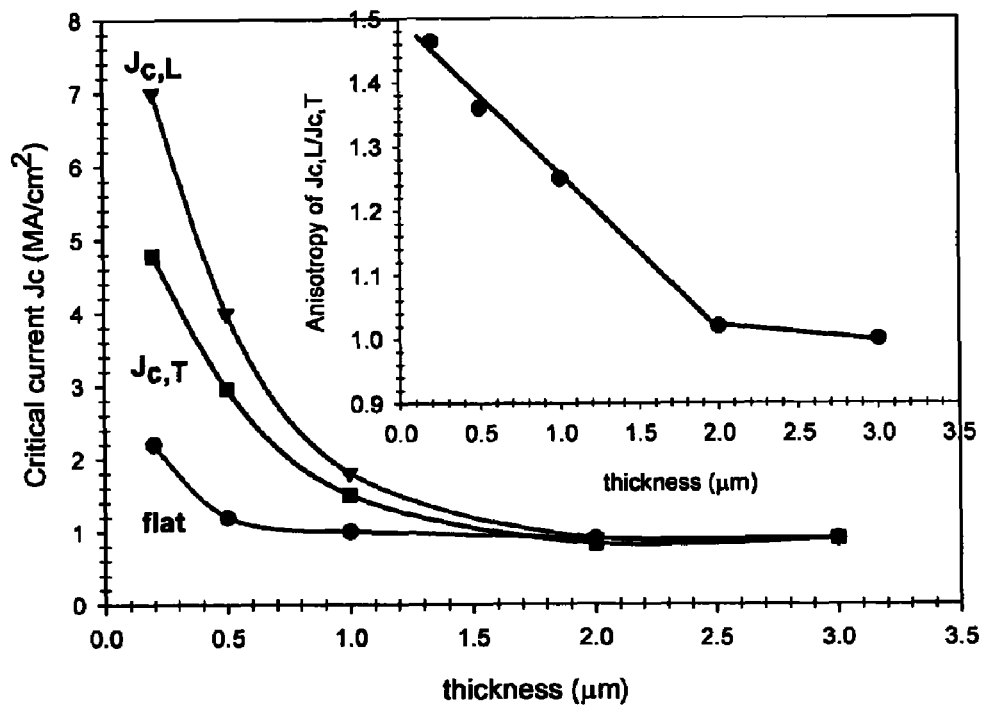

The decreasing $J_c$ anisotropy with increasing thickness at a fixed T was observed in the vicinal films. The same tendency, as mentioned before, was also observed at fixed thickness when temperature was increased from 10 K to 77 K. FIGS. 15(a) and 15(b) summarize the thickness dependence of $J_c$ and anisotropy of the flux penetration in flat and 10°-vicinal YBCO films at fixed temperatures of 10 K (FIG. 15(a)) and 77 K (FIG. 15(b)) respectively. The $J_c$ values in flat samples and in both directions of the 10°-vicinal YBCO samples decrease with increasing thickness. In addition, the $J_c$ anisotropy in the vicinal films also decreases slowly with thickness in the temperature range studied. In the 3.0 μm thick vicinal films there is no remarkable anisotropy in temperature range from 10 K to 77 K.

The flux behavior on MO images in flat films shows that all flat samples with different thickness show quite uniform flux penetration even at T=77 K. The apex angles between the diagonals of the roof pattern are equal to 90° for all flat samples. It means that the $J_c$s in both directions are the same and there is no anisotropy of flux penetration in flat samples.

FIG. 15 shows that the $J_c$ anisotropy decreases monotonically with increasing film thickness on the 10° vicinal YBCO films in the temperature range of 10 K to 77 K. An interesting feature observed in this experiment is the correlation between the $J_c$ anisotropy and $J_c$ values in vicinal samples. Above a certain temperature that is thickness dependent the $J_c$ values in vicinal films are higher than that of their flat counterparts. For example, the $J_c$ values in the 0.2 μm flat sample (FIG. 11) at temperatures 15 K or less is higher than $J_{c,L}$ in 10° vicinal sample, but it is decreasing faster with temperature than $J_{c,L}$. At temperatures greater than 15 K, a crossover occurred and $J_{c,L}$ became higher. In fact, a second crossover with $J_{c,T}$ followed at T about 45 K, leading to both $J_{c,L}$ and $J_{c,T}$ are higher than the $J_c$ in the flat film above 45 K. It should be realized that distinct growth steps are present when $J_c$ anisotropy is high. The presence of growth steps may increase the pinning force on magnetic vortices by forcing the vortices to move more preferably perpendicular to the steps because of a much larger current $J_{c,L}$ flowing parallel to the steps. However, in films thicker than 0.2 μm the influence of growth steps gradually decreases due to the healing of oriented planar antiphase boundaries formed during epitaxial film growth. The $J_c$ anisotropy shown in the inset of FIGS. 15(a) and 15(b) slowly decreases with film thickness, and the $J_{c,L}$ and $J_{c,T}$ become comparable in thickest samples.

As shown in the inset of FIG. 15(b), the decrease of $J_c$ anisotropy in vicinal films at T=77 K is not as uniform as it is at T=10 K. In the former case, the decrease of the $J_c$ anisotropy is linear at a rate of about –0.22/μm-thickness for sample thickness up to 2.0 μm. With increasing thickness, this decrease slowed down and at 3.0 μm thickness, no $J_c$ anisotropy was observable. The $J_c$ values in flat samples at T=77 K are less the $J_{c,T}$ in the vicinal samples in the thickness range between 0.2 and 2.0 μm. Above this thickness, $J_c$ in flat samples is comparable to $J_{c,L}$ and $J_{c,T}$ in the vicinal film.

The decrease of the $J_c$ anisotropy with thickness correlates with the evolution of the film microstructure in vicinal YBCO films as confirmed in the SEMs (FIGS. 4 and 5), where the growth steps diminish gradually with thickness while more pores appear. In the thin film regime, the growth steps are clearly seen and the $J_c$ anisotropy is a maximum at all temperatures. The appearance of pores starting at about 0.5 μm thickness may be a major factor complicating the microstructural evolution. The thicker vicinal films are highly porous while the growth steps are hardly visible and are of much larger width. One may speculate that the current in this "sponge"-like matter no longer takes a well-defined path along the specified direction microscopically, resulting in reduced $J_c$ anisotropy. At the maximum thickness of 3.0 μm, the vicinal film looks like a "melted cheese". The healing of the "steps" is accompanied by the diminishing of the $J_c$ anisotropy.

Another distinct feature of the vicinal YBCO films is the disappearance of the misoriented grains, which are typically seen on thick flat YBCO films. The increasing volume portion of misoriented grains is believed to be the major current obstacle in flat YBCO films of thickness above about 1.0 μm. The results herein indicate that vicinal growth may provide a solution for the misoriented-grain problem in thick YBCO films. This however cannot account for the enhanced $J_c$ values in thinner vicinal films.

At 77 K, it is possible to compare the $J_c$ values measured by both magnetization and MO methods in the flat and vicinal samples. Since the vicinal samples still have remarkable anisotropy at this temperature, the magnetically measured $J_c$s is limited by the lower $J_{c,T}$ across the growth steps. However, the magnetization $J_{c,T}$ shows higher values overall in 10°-vicinal YBCO films at 77 K and self-field as compared to their flat counterparts of the same thickness (see FIG. 7). These results correlate well with the $J_{c,T}$ taken on vicinal YBCO thin films using MO technique. As seen in FIG. 15(b) the MO defined $J_{c,T}$ is higher than the $J_c$ in flat films, and agrees qualitatively with the magnetic data in the thickness range less than 2.0 µm. Nevertheless, there is an approximately 2.5 times difference between the MO $J_{c,T}$ and magnetic $J_{c,T}$ at thickness of 0.2 µm. This discrepancy may be attributed to the difference in defining $J_c$ values in these two techniques science is well known that the magnetic $J_c$ obtains from SQUIDs magnetometer gives the lowest value of $J_c$. The magnetic $J_c$ represents an average $J_c$ over the entire sample since the calculation was based on the whole film dimension. However, any additional gross defects can reduce the measured magnetic moment and consequently reduce the magnetic $J_c$ from the intrinsic value. These irregular defects, as also visible in MO image in FIGS. 8(b) and 9(a), can reduce the magnetic $J_{c,T}$ to values lower than that due to planar antiphase boundaries.

In contrast, the magnetic (FIG. 7) and MO (FIG. 15(b)) $J_c$ values in the flat samples are very close at thickness less than 2.0 µm. On the other hand, all flat samples at 77 K exhibit more uniform flux behavior with less remarkable macroscopic defects inside the samples. Some defects are located only along the sample edges as seen in FIG. 8(a). These defects can also possibly reduce the magnetic $J_c$, while they practically have no influence on the macroscopic flux front penetration used for definition of the MO $J_c$ values.

In sum, flat and 10° vicinal YBCO films were fabricated with variable thickness of 0.2, 0.5, 1.0, 2.0, and 3.0 µm. The different YBCO nucleation mechanisms on flat and vicinal substrates resulted in different patterns of microstructural evolution with increasing thickness, and therefore different $J_c$ vs. thickness behaviors. The flat films nucleate via island-type mode and develop into c-axis oriented dominant, plus certain portion of misoriented grains at larger thickness with overall dense structure. The vicinal films, on the other hand, nucleate via step-flow mode and developed into a highly porous structure, with minimal amount of misoriented grains and impurity phases at large thickness. The vicinal films showed overall higher $J_c$ values at 77 K than their flat counterparts, confirming the correlation between the microstructure and the $J_c$-thickness behavior. The MO images showed that the magnetic flux penetration in the flat samples is isotropic at different thickness, while it is highly anisotropic in the vicinal samples. The anisotropy decreases with film thickness and temperature. The interplay between the anisotropic current flow and the porous structure in vicinal YBCO films defined a more favorable current flow path. In coated conductor applications, if the steps are parallel to the tape length, a higher $J_c$ can be obtained by growing YBCO films at a small vicinal angle.

Example 5

Tuning of $YBa_2Cu_3O_{7-\delta}$ Vicinal Films by Insertion of $Y_2BaCuO_5$ Nanoparticles The foregoing examples suggest that improvement of the $J_c$ may correlate intimately with the porous microstructure of the vicinal YBCO films. In fact, pore surfaces may provide additional pinning on magnetic vortices and thus improve $J_c$. In addition, the pores can divide the current path into multifilamentary like and the effective dimension for each filament is reduced to a length scale comparable to the magnetic penetration depth $\lambda$, which is on the order of few hundreds of nanometers for YBCO. In should be pointed out that no magnetic vortices can be formed inside the superconductor film when the film dimension perpendicular to the current is smaller than $2\lambda$, and in this case the theoretical upper limit of the Jc—the depairing Jc can be achieved. The downside of including pores in HTS films is the reduction of cross-sectional area for the current flow, which can result in reduced $J_c$. To minimize reduction of the current cross-sectional area so as to obtain a net $J_c$ enhancement, the dimension of the pores need to be as small as possible, preferably on the order of a few times of the coherence length $\xi$.

Although the porosity in the bulks can be altered using secondary phase doping and processing control, tuning porosity in in-situ grown HTS films remains challenging, especially at the nanometer scale. As shown in the prior examples, in the vicinal YBCO films, the dimension of the pores is typically in the range of submicron at film thickness less than 1.0 µm and increases to a few microns at about 3.0 µm film thickness. If the pores in the vicinal YBCO films are due to the strain developed when the a-b planes of YBCO film are tilted at the miscut angle with respect to the substrates, which is highly probable, the increase of the pore dimension at larger thickness may be a result of the larger scale strain accumulated through the film thickness. To reduce the dimension of the pores in the vicinal YBCO films, one must be able to control the strain at microscopic scales.

In this example, it was demonstrated that local control of strain could be achieved by inserting island-like nanoparticles ("NPs") that deform the YBCO lattice within a short range comparable to the dimension of the NP. By introducing this localized strain, the development of the large-scale strain can be impeded, leading to smaller and denser pores on the YBCO matrix. In this example, the effect of inserting $Y_2BaCuO_5$ (211) NPs on the microstructure of vicinal YBCO films using an in-situ multilayer deposition scheme developed by Haugen on flat substrates. See Haugen et al., *Island growth of $Y_2BaCuO_5$ nanoparticles in $(211_{~1.5\ nm}/123_{~10\ nm}) \times N$ composite multilayer structures to enhance flux pinning of $YBa_2Cu_3O_{7-\delta}$ films*, J. Mater. Res., 18, 2618 (2003); Haugen et al., *Addition of nanoparticle dispersions to enhance flux pinning of the $YBa_2Cu_3O_{7-x}$ superconductor*, Nature 430, 867 (2004), which are incorporated by reference. Hereafter, YBCO fabricated with 211 NPs will be called "YBCO/211 films" in contrast to the ordinary YBCO films.

The YBCO and YBCO/211 films were fabricated on flat and 5°, 10°, 15°, and 20° miscut or vicinal STO substrates using pulsed laser deposition. The processing conditions were optimized first on YBCO films and the same were applied for fabricating the YBCO and YBCO/211 films. To insert 211 NPs uniformly, layers of YBCO and 211 NPs were deposited by PLD in an alternating fashion. Deposition of YBCO layers was performed using between about 50 and 500 pulses, and deposition of the 211 NPs was performed using between about 5 to 50 pulses. Specifically, YBCO layers were formed using 60, 180, or 360 pulses, resulting in layered of about 5, 10, and 20 nm, respectively. The YBCO/211 NPs were formed using 7, 14, or 28 pulses. The 211 NPs were dispersed in an island-like fashion having at diameter at the film surface of about 10 to 40 nm, and having a very small thickness, usually less than 5 nm and preferably around 1 nm.

The exemplary YBCO and YBCO/211 film shown herein were prepared with 180 pulses of YBCO and 14 pulses of 211. This produced an alternating layered structure of 9 nm nominal single layer thickness YBCO and 1 nm nominal single layer thickness 211 NPs, where the total film deposited consisted of 15 to 200 bi-"layers" to vary the total film thickness. The 211 NPs are typically about 8 nm in size in these structures, with area number density greater than $4 \times 10^{11}$ per $cm^2$. To avoid run-to-run variations, the YBCO/211 (or YBCO) films of the same thickness on the two types of substrates, flat and vicinal, were made in the same run.

Figure 16:
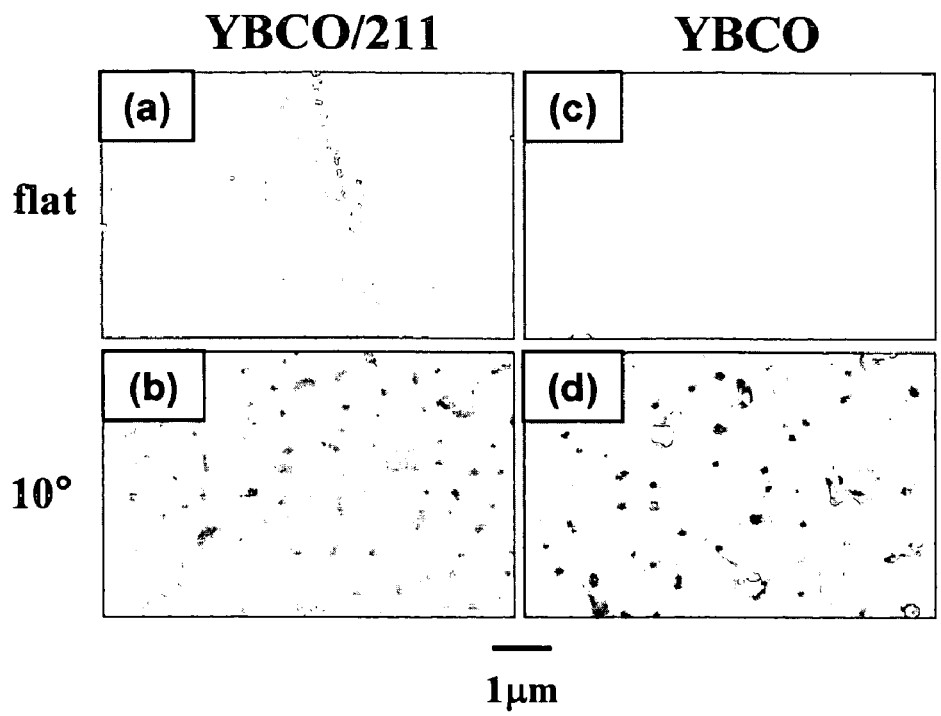
FIG. 16 contains SEM micrographs of 0.2 μm thick YBCO/211 and YBCO films. Left column: YBCO/211 films on (a) flat and (b) 10° miscut STO substrates. Right column: YBCO films on (c) flat and (d) 10° miscut STO substrates.

The surface morphology of the samples was analyzed using scanning electron microscopy (SEM) and the results are illustrated in FIG. 16 on four films: YBCO/211 on flat [FIG. 16(a)] and 10° miscut [FIG. 16(b)] STO, respectively; and YBCO on flat [FIG. 16(c)] and 10° miscut [FIG. 16(d)] STO, respectively. On the flat STO substrates, the YBCO films are dense and nearly featureless, particularly for the YBCO/211 film, suggesting that 211 NPs alone will not generate porosity for these deposition conditions. On the miscut STO substrates, on the other hand, both YBCO and YBCO/211 films are highly porous but differences can be observed. The majority of pores in both types of vicinal films have a circular shape with diameters ranging from 70 nm to 300 nm. With 211 NPs, some oblong-shaped and boomerang shaped pores are also observable [FIG. 16(b)], resulting possibly from two nearby pores coalescing. Interestingly, a higher pore density was observed on the YBCO/211 vicinal films as compared to that in the YBCO vicinal films. At 0.2 μm thickness, the pore density for the vicinal YBCO/211 film is approximately $2.48 \times 10^8$ pores/$cm^2$ while that for the vicinal YBCO film is $1.36 \times 10^8$ pores/$cm^2$. This means that the pore density was almost doubled when the 211 NPs were inserted in the vicinal YBCO films as expected from local perturbation of the strain in the vicinal films with NP insertion. This may explain the appearance of more non-circular shaped pores in the vicinal YBCO/211 films as a consequence of the circular pores coalescing more often at the higher density.

Figure 17:
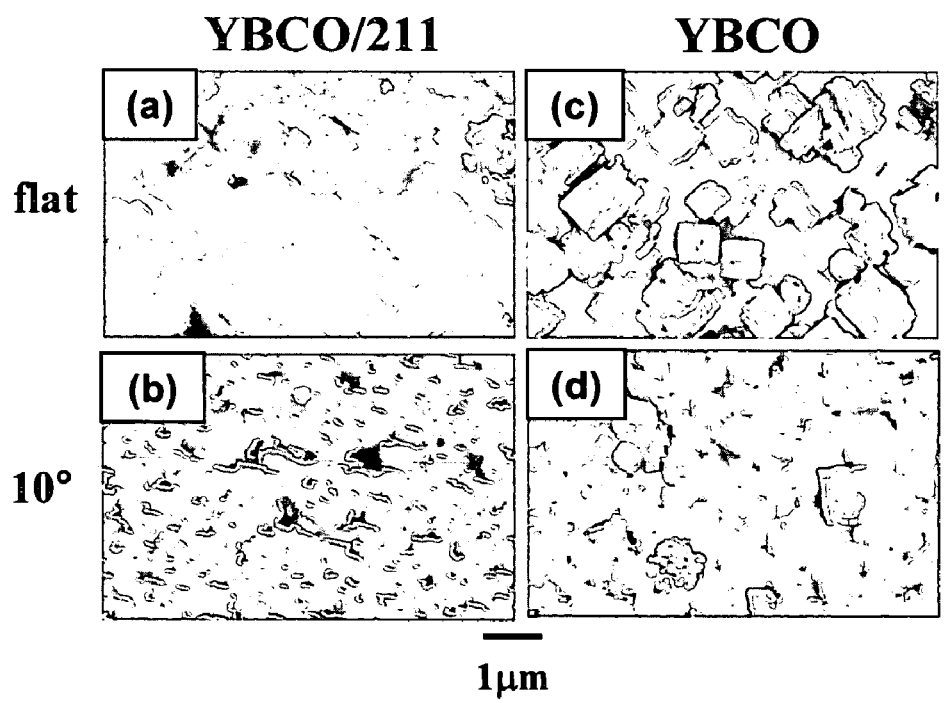
FIG. 17 contains SEM micrographs of 2.0 μM thick YBCO/211 and YBCO films. Left column: YBCO/211 films on (a) flat and (b) 10° miscut STO substrates. Right column: YBCO films on (c) flat and (d) 10° miscut STO substrates.

The evolution of the film microstructure with respect to film thickness differs in the cases of with and without 211 NPs. FIG. 17 illustrates the SEM pictures of YBCO/211 and YBCO films with 2.0 μm thickness on flat (top row) and vicinal (bottom row) STO substrates, respectively. On flat YBCO films [FIG. 17(b)], many misoriented grains were visible as reported above. With 211 NP insertion, the misoriented grains were replaced by a large number of microcracks [FIG. 17(a)], which may be due to the increase of the strain in the film with increasing thickness. None of the above-mentioned features, however, were observed on the vicinal samples. The pores remained through the thickness while their shapes were highly deformed. In the vicinal YBCO/211 film, the pore size is much smaller at larger thickness, except for a few large pores. Similarly, the vicinal YBCO film without 211 NPs also has deformed pores but the pore size is bigger and the pore density is smaller than in the vicinal YBCO/211 film.

Figure 18:
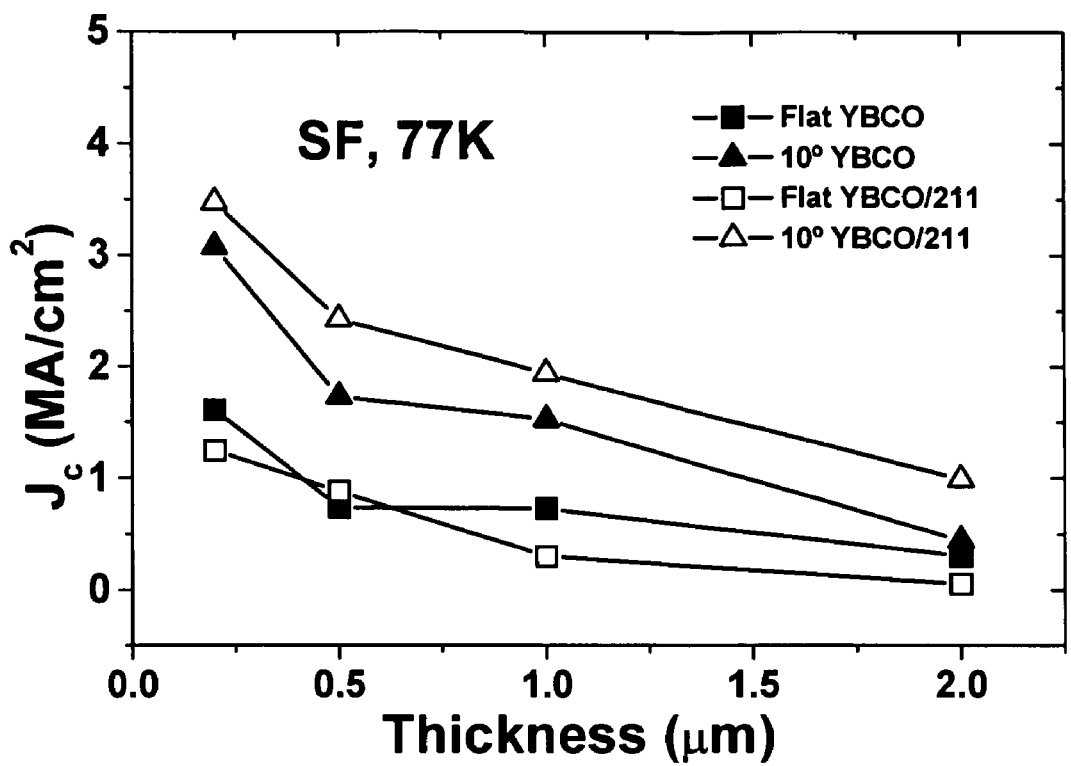
FIG. 18 shows $J_c$-thickness plots of YBCO and YBCO/211 films on flat and vicinal STO substrates.

The film microstructure correlates closely with the $J_c$. FIG. 18 compares the $J_c$-thickness curves measured magnetically at 77 K and SF on flat and vicinal YBCO/211 and YBCO films using a superconducting quantum interference device magnetometer. The Bean model was applied for calculation of the $J_c$. Interestingly, the two types of flat YBCO films, with or without 211 NPs, show similar $J_c$ values and $J_c$-thickness dependence, suggesting that the incorporation of 211 NPs alone in YBCO films does not improve the $J_c$ at SF (or low field <0.5-1.0 T) of YBCO films for the given YBCO/211 structure. In contrast, the vicinal YBCO/211 films have a consistently higher $J_c$ than the vicinal YBCO films without 211 NPs. Since the former has a higher density of the pores, a plausible explanation for its higher $J_c$ is the additional porosity induced by 211 NP insertion including a smaller pore dimension and higher pore density.

For the 0.2 μm thick 10° vicinal YBCO/211 film, its $J_c$ is 2.2 times higher than that of the flat YBCO film and is about 15% higher than the 10° vicinal YBCO film. At 2.0 μm thickness, the $J_c$ of 10° vicinal YBCO/211 film is almost 3.3 times higher than the flat YBCO film and 2.2 times than the 10° vicinal YBCO film. This suggests that the $J_c$ of the vicinal YBCO/211 films decreases more slowly than in the other samples.

Figure 19A:
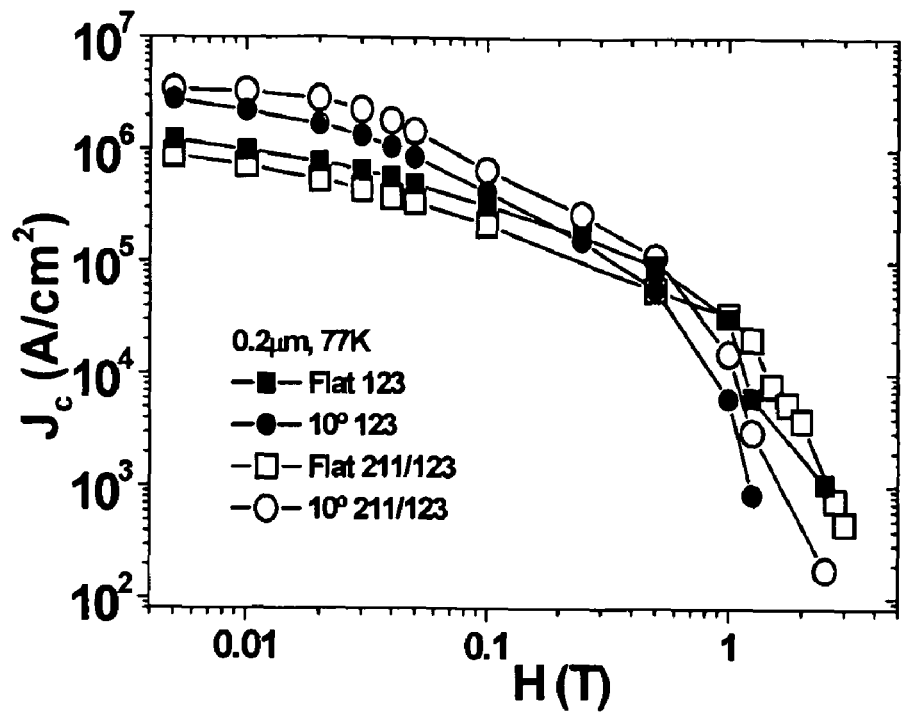
FIG. 19 shows (a): $J_c$-H plots of 0.2 μm thick YBCO and YBCO/211 flat and vicinal films; and (b) $J_c$-H plots of 2.0 μm thick YBCO and YBCO/211 flat and vicinal films.
Figure 19B:
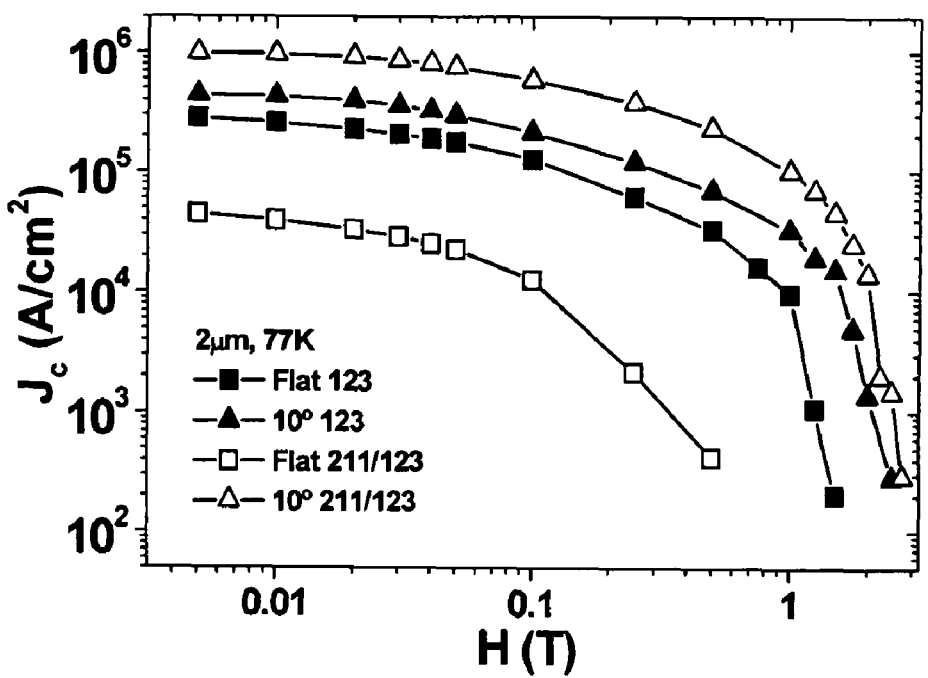

The in-field $J_c$ is depicted as a function of magnetic field (H) in FIG. 19 for 0.2 μm [FIG. 19(a)] and 2.0 μm [FIG. 19(b)] thick YBCO/211 and YBCO films on flat and vicinal substrates. At the smaller thickness, the $J_c$-H curves for the vicinal films cross over with those for the flat films in the H range of 0.5-1.0 Tesla. Below the crossover, the vicinal samples have significantly higher $J_c$ values. Since the flat YBCO/211 film has lower $J_c$ in this regime, it is unlikely that the 211 NPs alone are responsible for the improved $J_c$ in the vicinal YBCO/211 film for this regime. Instead, the greater porosity is the more probable reason for the improvements to $J_c$ for fields lower than about 0.5-1.0 T based on the fact that the $J_c$ of the vicinal YBCO/211 is even higher than that of the vicinal YBCO sample. Above about 1.0 T, the nanoparticulate additions appear to be the primary cause of the $J_c$ improvement. The occurrence of the crossover indicates that the pores at the current dimension and density benefit pinning of magnetic vortices mostly in the lower field range below about 1.0 Tesla. It may be possible for the crossover point to be pushed to higher H field by reducing the pore dimension and increasing pore density. In fact, no crossover was observed at the larger thickness of 2.0 μm [FIG. 19(b)], which is not surprising considering the reduced pore dimension with increasing film thickness. The vicinal films have overall higher $J_c$ values in the whole H range. As discussed above, negligible misoriented grains were formed in the vicinal samples, in a sharp contrast to the large fraction of misoriented grains on the flat YBCO films at large thickness, which obstruct $J_c$. For the vicinal films, the one with 211 NPs (open triangles) has approximately a factor of two higher $J_c$ in most H range as compared to the one without (solid triangles). This enhanced $J_c$ is attributable to the combined benefit of more favorably engineered porous structure and 211 NP pinning, although other mechanisms, such as anisotropy of $J_c$, should not be excluded.

Interestingly, the flat YBCO/211 sample (open squares) of 2.0 μm thickness has a significantly lower $J_c$, even compared to that of the flat YBCO sample (solid squares) and it is theorized that the observed microcracks in the former further reduced its $J_c$. It should be pointed out that both misoriented grains and microcracks are a consequence of the strain developed in the ceramic YBCO films due to various reasons, including film-substrate lattice mismatch and 211 NPs insertion under not optimized processing conditions. The fact that no misoriented grains and microcracks appeared in the vicinal films with or without 211 NPs suggests that the formation of pores may release the strain accumulated with increasing thickness in a favorable manner. Thus, the combination of pores and NPs provides a desired scheme for achieving high $J_c$ in thick YBCO films via microstructure engineering.

The anisotropy in the vicinal films is likely a dominant reason for the occurrence of the porous structure. YBCO and most other HTS films have a layered structure. When the film is grown at a tilt angle with respect to the normal of the substrate, the mechanical strength is anisotropic in the plane of the vicinal film with the weaker direction perpendicular to the atomic steps (generally regarded as the transverse direction). This weaker mechanical strength originates from the weaker interaction along the c-axis of the YBCO and allows the film to be torn apart much easier along the transverse direction of the vicinal film. The insertion of 211 NPs provides an additional tuning to the local strain, leading to a higher density and smaller pore dimension in the porous structure of the vicinal film. The higher $J_c$ observed in these vicinal YBCO/211 films has further confirmed the intimate correlation between $J_c$ and film microstructure and predicts that a better $J_c$ may be achieved when the film microstructure is optimized.

In summary, this example showed that the porosity of vicinal YBCO films can be tuned using 211 NPs inserted via a multilayer growth process. By inserting 1 nm layer of 211 NPs after the growth of each 9 nm thick YBCO layer on 10° miscut STO substrates, the pore density can be nearly doubled and the pore dimension reduced. The investigation of $J_c$ in these porous YBCO/211 films of thickness ranging from 0.2 to 2.0 μm revealed an overall enhanced $J_c$ as compared to reported results, suggesting a correlation between $J_c$ and microstructure of the film. The result suggests that the combination of pores and NPs may provide a promising scheme for achieving high $J_c$ in thick YBCO films and coated conductors via microstructure engineering.

From the foregoing it will be seen that this invention is one well adapted to attain all ends and objectives herein-above set forth, together with the other advantages which are obvious and which are inherent to the invention. Since many possible embodiments may be made of the invention without departing from the scope thereof, it is to be understood that all matters herein set forth in the accompanying figures are to be interpreted as illustrative, and not in a limiting sense. While specific embodiments have been shown and discussed, various modifications may of course be made, and the invention is not limited to the specific forms or arrangement of parts and steps described herein, except insofar as such limitations are included in the following claims. Further, it will be understood that certain features and subcombinations are of utility and may be employed without reference to other features and subcombinations. This is contemplated by and is within the scope of the claims.

What is claimed is:

1. A superconductive device comprising:
   a vicinal substrate;
   a porous superconducting layer overlying said substrate and having a superconducting layer-substrate interface, said superconducting layer having a thickness greater than 0.5 microns, and having a plurality of pores having a tube-like geometry, wherein said pores are formed 30 to 50 nm from the interface and run through several micron thickness.

2. The superconductive device of claim 1 wherein said superconducting layer comprises $Yba_2Cu_3O_{7-\delta}$.

3. The superconductive device of claim 1 wherein the vicinal substrate has miscut angle ranging between 5° and 20°.

4. The superconductive device of claim 1 wherein the pores have a circular cross-section and have a diameter ranging between about 70 nm and 300 nm.

5. The superconductive device of claim 1 wherein the pores have a circular cross section having a diameter of about one micron and the superconducting layer is about three microns thick.

6. The superconductive device of claim 1 where the superconducting layer exhibits step-flow growth, and the pores are rectangular in shape, and are either parallel or perpendicular to the steps in the layer.

7. The superconductive device of claim 6 wherein said rectangular pores are formed by one or more smaller pores coalescing together.

8. The superconductive device of claim 1 wherein the pores are irregularly shaped, and exhibit the "melted cheese" surface morphology illustrated in FIG. 4(j), FIG. 4(k), or FIG. 4(l).

9. A method for forming a superconducting device comprising:
   providing a substrate;
   tilting the substrate at an angle greater than zero to provide a vicinal substrate;
   providing a porous superconducting layer with a thickness above 0.5 micron over said vicinal substrate, said superconducting layer formed by alternating a deposition of a superconducting material film with a deposition of nanoparticles of a second material, wherein said porous superconducting layer comprises pores having a tube-like geometry and run through several micron thickness of the film, and wherein said porous are formed 30 to 50 nm from an interface between the superconducting layer and the substrate.

10. The superconductive device of claim 1 having a pore density greater than $2.48 \times 10^8$ pores/cm².

11. The superconductive device of claim 1 wherein the superconducting layer has a thickness of about two to three microns.

12. A method for improving the critical current density of a superconducting article having a thickness above 0.5 microns comprising:
   providing a substrate;
   tilting the substrate an angle greater than zero to provide a vicinal substrate;
   depositing a superconducting layer over said vicinal substrate, said superconducting layer having a thickness greater than 0.5 microns and having a plurality of pores having a tube-like geometry, wherein said pores are formed 30 to 50 nm from the interface between the superconducting layer and substrate and run through several micron thickness.

13. The method of claim 12 wherein said superconducting layer comprises $YBa_2CU_3O_{7-\delta}$.

14. The method of claim 12 wherein said vicinal substrate has miscut angle ranging between 5° and 20°.

15. The method of claim 12 wherein said pores have a circular cross section having a diameter of about one micron and the superconducting layer is about three microns thick.

16. The method of claim 12 wherein the superconducting layer exhibits step-flow growth, and the pores are rectangular in shape and are either parallel or perpendicular to the steps in the layer.

17. The method of claim 16 wherein said rectangular pores are formed by one or more smaller pores coalescing together.

18. The method of claim 12 wherein the pores are irregularly shaped, and exhibit the "melted cheese" surface morphology illustrated in FIG. 4(j), FIG. 4(k), and FIG. 4(l).

19. The method of claim 12 wherein said pores have a pore density above about $2.48 \times 10^8$ pores/cm².

20. The method of claim 12 wherein the superconducting layer has a thickness of about 2.0 to 3.0 microns.

21. The method of claim 12 further comprising depositing nanoparticles into said superconducting layer.

22. The method of claim 21 wherein said nanoparticles are comprised of $Y_2BaCuO_5$(211).

23. The method of claim 9 wherein said superconducting layer has a thickness greater than 0.5 microns.

24. The method of claim 9 wherein said superconducting layer has a thickness of up to 3.0 microns.

25. The method of claim 9 wherein said nanoparticles are comprised of $Y_2BaCuO_5$ (211), and said superconducting material is comprised of $YBa_2Cu_3O_{7-\delta}$.

26. The method of claim 9 further wherein said method includes about 15 to 200 alternating deposition steps.

27. The method of claim 9 wherein the vicinal substrate has miscut angle ranging between 5° and 15°.

28. A superconducting device formed by the method of claim 9.

29. The superconducting device of claim 28 wherein said superconducting layer has a thickness of up to 3.0 microns.

30. The superconducting device of claim 28 wherein said nanoparticles are comprised of $YBa_2CuO_5$(211), and said superconducting material is comprised of $YBa_2Cu_3O_{7-\delta}$.

31. The superconducting device of claim 28 wherein said method includes about 15 to 200 alternating steps.

32. The superconducting device of claim 28 wherein the vicinal substrate has miscut angle ranging between 5° and 15°.

33. The superconducting device of claim 28 wherein at least some of the pores are oblong-shaped or boomerang shaped.

* * * * *